(12) United States Patent
Kang et al.

(10) Patent No.: US 12,557,648 B2
(45) Date of Patent: Feb. 17, 2026

(54) SEMICONDUCTOR PACKAGE

(71) Applicant: Samsung Electronics Co., Ltd., Suwon-si (KR)

(72) Inventors: Sunggu Kang, Suwon-si (KR); Youngdeuk Kim, Suwon-si (KR); Mina Choi, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 409 days.

(21) Appl. No.: 18/305,726

(22) Filed: Apr. 24, 2023

(65) Prior Publication Data
US 2023/0395459 A1 Dec. 7, 2023

(30) Foreign Application Priority Data
Jun. 2, 2022 (KR) .................. 10-2022-0067699

(51) Int. Cl.
*H01L 23/367* (2006.01)
*H01L 23/00* (2006.01)
(Continued)

(52) U.S. Cl.
CPC .... *H01L 23/3675* (2013.01); *H01L 23/49816* (2013.01); *H01L 23/49833* (2013.01); *H01L 23/49838* (2013.01); *H01L 24/16* (2013.01); *H01L 24/32* (2013.01); *H01L 24/73* (2013.01); *H01L 25/162* (2013.01); *H01L 25/165* (2013.01); *H10B 80/00* (2023.02); *H01L 2224/16145* (2013.01); *H01L 2224/16227* (2013.01); *H01L 2224/32145* (2013.01);
(Continued)

(58) Field of Classification Search
CPC .......... H01L 23/3675; H01L 23/49816; H01L 23/49833; H01L 24/16; H01L 24/32
See application file for complete search history.

(56) References Cited

U.S. PATENT DOCUMENTS 9,583,430 B2 * 2/2017 Park ................... H05K 1/0207
9,653,373 B2   5/2017 Kim et al.
(Continued)

FOREIGN PATENT DOCUMENTS

CN       109698170 B     3/2021
KR   10-2021-0147453 A  12/2021
(Continued)

*Primary Examiner* — Thao P Le
(74) *Attorney, Agent, or Firm* — Wolf, Greenfield & Sacks, P.C.

(57) ABSTRACT

A semiconductor package includes: a first semiconductor chip on a first package substrate; a second semiconductor chip on a second package substrate; an interposer between the first semiconductor chip and the second package substrate; and a heat dissipation layer on the interposer, wherein the first and second semiconductor chips are spaced apart from each other horizontally and do not overlap in a vertical direction, and wherein a first portion of the heat dissipation layer at least partially overlapping the first semiconductor chip in the vertical direction and a second portion of the heat dissipation layer at least partially overlapping the second semiconductor chip in the vertical direction are spaced apart from each other, and the first portion is positioned around an outer boundary of the second portion.

20 Claims, 15 Drawing Sheets

(51) Int. Cl.
   *H01L 23/498* (2006.01)
   *H01L 25/16* (2023.01)
   *H10B 80/00* (2023.01)
(52) U.S. Cl.
   CPC ............... *H01L 2224/32225* (2013.01); *H01L 2224/73204* (2013.01); *H01L 2924/1431* (2013.01); *H01L 2924/1434* (2013.01)

(56) References Cited

U.S. PATENT DOCUMENTS

| | | | |
|---|---|---|---|
| 10,546,844 | B2 | 1/2020 | Kim et al. |
| 10,937,771 | B2 | 3/2021 | Kim et al. |
| 11,164,754 | B2 * | 11/2021 | Tsai ..................... H01L 25/105 |
| 2017/0358557 | A1 | 12/2017 | Chen et al. |
| 2020/0219783 | A1 * | 7/2020 | Kim ................... H01L 23/5389 |
| 2021/0043612 | A1 | 2/2021 | Lee et al. |
| 2021/0159147 | A1 * | 5/2021 | Lin ..................... H01L 23/3121 |
| 2021/0233829 | A1 | 7/2021 | Pei et al. |
| 2023/0026141 | A1 * | 1/2023 | Chen .................. H01L 25/0655 |
| 2023/0066895 | A1 * | 3/2023 | Park .................... H01L 25/0652 |
| 2024/0063085 | A1 * | 2/2024 | Park .................... H01L 23/49816 |
| 2024/0332150 | A1 * | 10/2024 | Park .................... H01L 25/105 |
| 2024/0371718 | A1 * | 11/2024 | Youn ................... H01L 25/105 |
| 2025/0079338 | A1 * | 3/2025 | Kang ................... H01L 23/5385 |
| 2025/0140695 | A1 * | 5/2025 | Kang ................... H01L 23/3672 |
| 2025/0149456 | A1 * | 5/2025 | Kim ..................... H01L 24/13 |
| 2025/0183214 | A1 * | 6/2025 | Ha ...................... H01L 25/105 |
| 2025/0183242 | A1 * | 6/2025 | Ahn ..................... H01L 25/167 |

FOREIGN PATENT DOCUMENTS

| | | |
|---|---|---|
| KR | 10-2021-0150153 A | 12/2021 |
| KR | 10-2022-0019148 A | 2/2022 |

* cited by examiner

SEMICONDUCTOR PACKAGE

CROSS-REFERENCE TO RELATED APPLICATION

This application is based on and claims priority under 35 U.S.C. § 119 to Korean Patent Application No. 10-2022-0067699, filed on Jun. 2, 2022, in the Korean Intellectual Property Office, the disclosure of which is incorporated by reference herein in its entirety.

BACKGROUND

The inventive concept relates to a semiconductor package, and more particularly, to a semiconductor package including an interposer.

Due to rapid development within the electronics industry and the increasing demands of users, electronic devices have become more compact, more versatile, and higher-capacity. Accordingly, semiconductor packages that include a plurality of semiconductor chips are increasingly desired. Semiconductor packages providing connections between highly integrated semiconductor chips having an increased number of input/output (I/O) connection terminals through use of an interposer have been proposed and developed.

SUMMARY

The inventive concept provides a semiconductor package with improved reliability.

According to some embodiments, a semiconductor package is provided. The semiconductor package includes a first semiconductor chip on a first package substrate, a second semiconductor chip on a second package substrate, an interposer between the first semiconductor chip and the second package substrate, and a heat dissipation layer on the interposer, wherein the first and second semiconductor chips are spaced apart from each other horizontally and do not overlap in a vertical direction, and wherein a first portion of the heat dissipation layer at least partially overlapping the first semiconductor chip in the vertical direction and a second portion of the heat dissipation layer at least partially overlapping the second semiconductor chip in the vertical direction are spaced apart from each other, and the first portion is positioned around an outer boundary of the second portion.

According to example embodiments, a semiconductor package is provided. The semiconductor package includes a first semiconductor chip on a first package substrate, a second semiconductor chip on a second package substrate, an interposer between the first semiconductor chip and the second package substrate, and a heat dissipation layer on the interposer, wherein, when the first semiconductor chip and the second semiconductor chip are projected on a plane including the heat dissipation layer, a first projection, which is a projection of the first semiconductor chip in a first region of the plane comprising the heat dissipation layer, and a second projection, which is a projection of the second semiconductor chip in a second region of the plane comprising the heat dissipation layer, do not overlap each other, and wherein a first portion of the heat dissipation layer at least partially overlapping the first projection and a second portion of the heat dissipation layer at least partially overlapping the second projection are arranged at least partially to be spaced apart from each other, and wherein the first portion is is positioned around an outer boundary of the second portion, and connected to the second portion via a bridge portion of the heat dissipation layer.

According to example embodiments, a semiconductor package is provided. The semiconductor package includes a first semiconductor chip on a first package substrate, a second semiconductor chip on a second package substrate, an interposer between the first semiconductor chip and the second package substrate, a heat dissipation layer and a conductive connector on the interposer, and an adhesive layer between the interposer and the heat dissipation layer, wherein, when the first semiconductor chip and the second semiconductor chip are projected on a plane including the heat dissipation layer, a first projection, which is a projection of the first semiconductor chip in a first region of the plane comprising the heat dissipation layer, and a second projection, which is a projection of the second semiconductor chip in a second region of the plane comprising the heat dissipation layer, do not overlap each other, and wherein a first portion of the heat dissipation layer at least partially overlapping the first projection and a second portion of the heat dissipation layer at least partially overlapping the second projection are arranged to be spaced apart from each other, and wherein the first portion comprises an inner boundary defining an interior region, and the second portion is in the interior region of the first portion, and the conductive connector is between the first portion and the second portion.

BRIEF DESCRIPTION OF THE DRAWINGS

Embodiments will be more clearly understood from the following detailed description taken in conjunction with the accompanying drawings in which.

DETAILED DESCRIPTION OF THE EMBODIMENTS

Figure 1A:
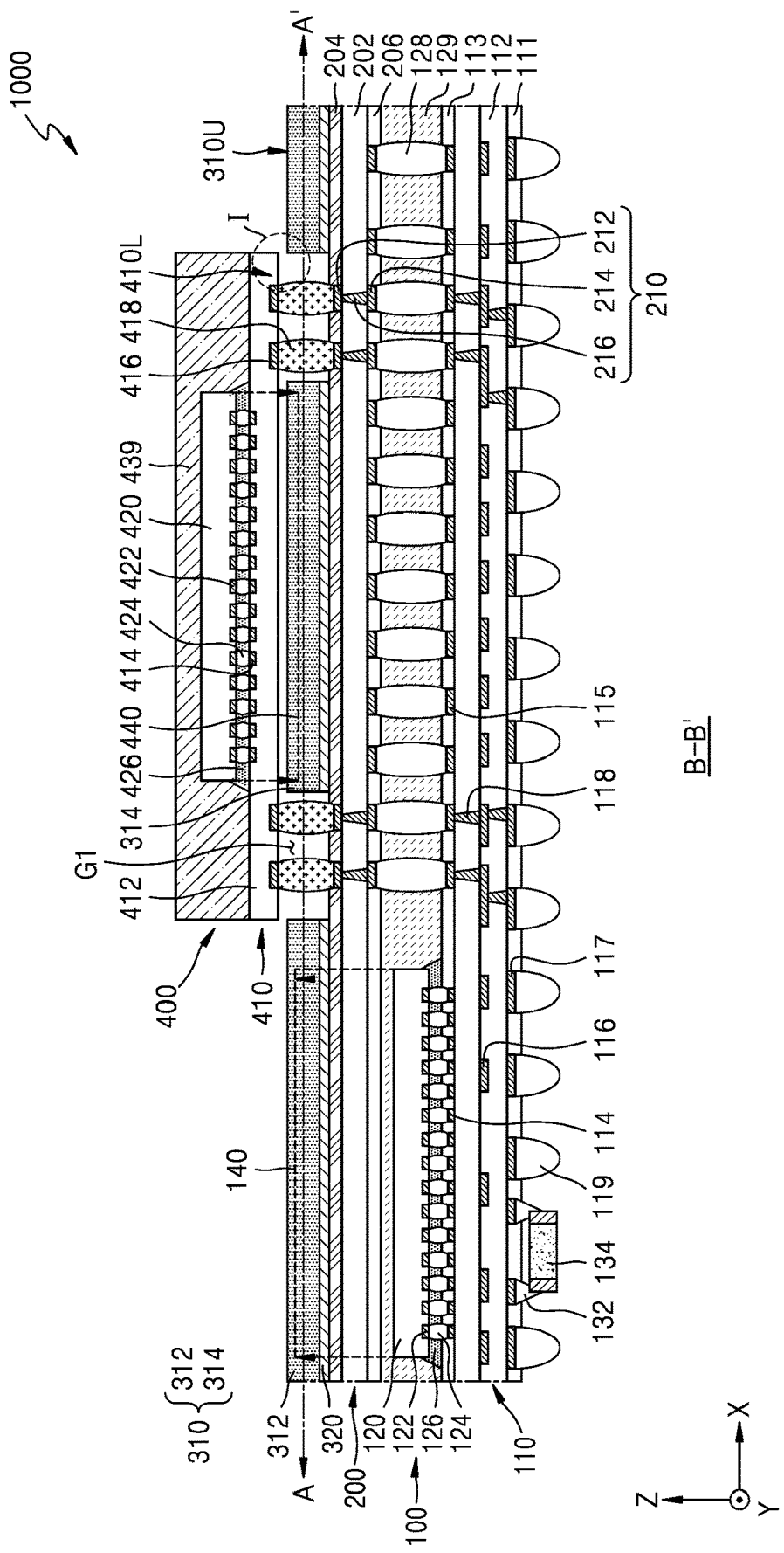
FIG. 1A is a cross-sectional view of a semiconductor package according to an example embodiment.

Hereinafter, embodiments of the inventive concept are described in detail with reference to the accompanying drawings. Identical reference numerals are used for the same components in the drawings, and a duplicate description thereof will be omitted.

Figure 1B:
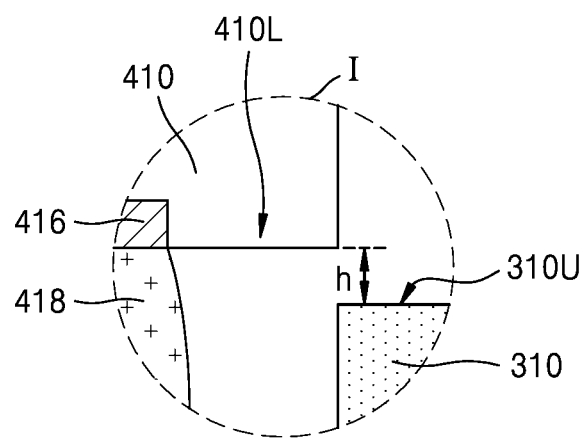
FIG. 1B is an enlarged view of region I in FIG. 1A.
Figure 2:
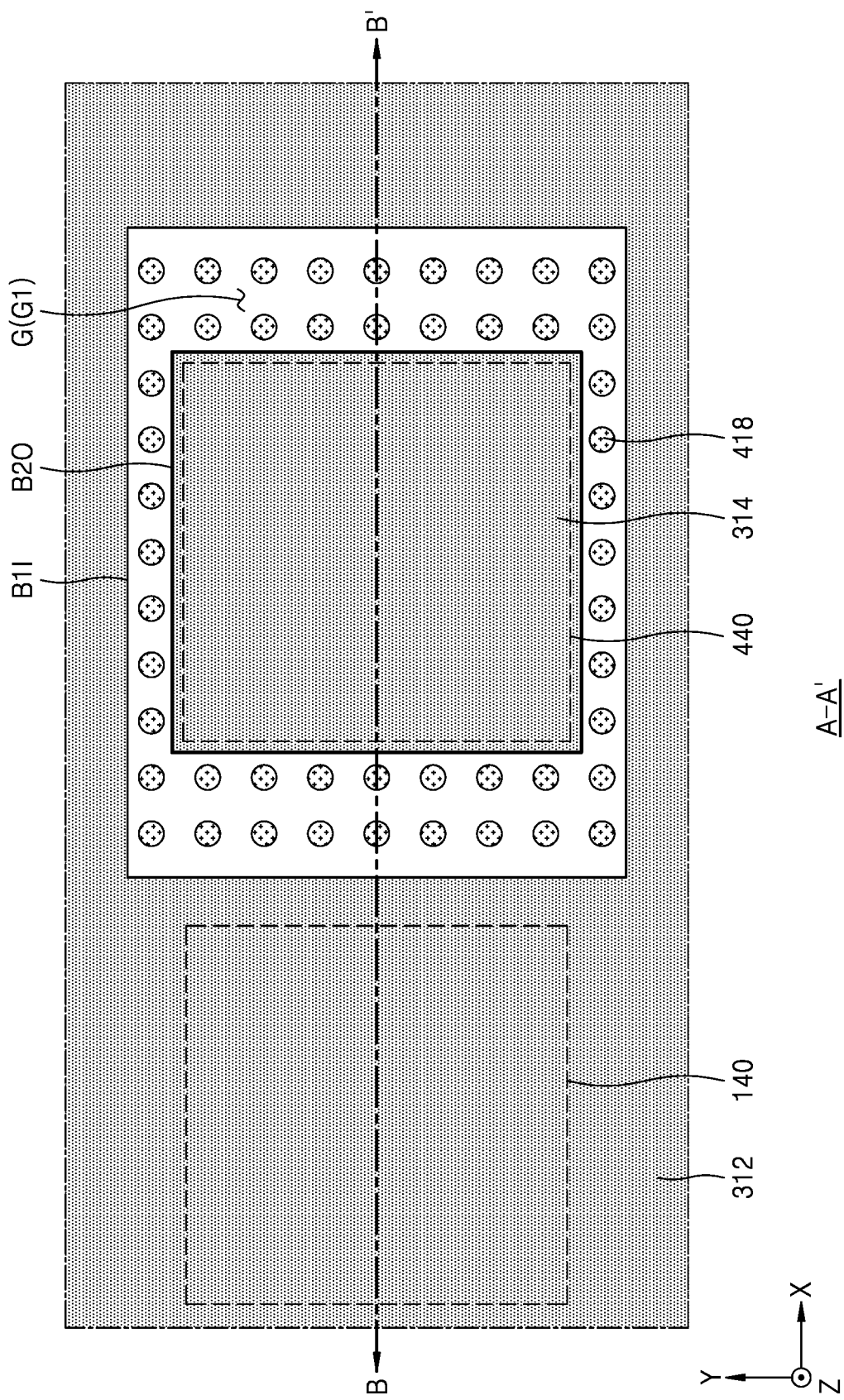
FIG. 2 is a planar view of the semiconductor package of FIGS. 1A and 1B, at a line A-A' of FIG. 1A.

FIG. 1A is a cross-sectional view from a side surface of a semiconductor package 1000, according to some embodiments. FIG. 1B is an enlarged view of region I in FIG. 1A. FIG. 2 is a planar view of the semiconductor package of FIGS. 1A and 1B at a line A-A' of FIG. 1A.

Referring to FIGS. 1A, 1B, and 2, the semiconductor package 1000 may include a first package 100 and a second package 400, and the second package 400 may be arranged on the first package 100 vertically (that is, in a Z direction). For example, the semiconductor package 1000 may include a semiconductor package of a package-on-package type. According to example embodiments, an interposer 200 may be arranged between the first package 100 and the second package 400, and a heat dissipation layer 310 may be arranged on the interposer 200. In this case, the heat dissipation layer 310 may be arranged under the second package 400.

According to example embodiments, the first package 100 may include a first package substrate 110 and a first semiconductor chip 120, and the second package 400 may include a second package substrate 410 and a second semiconductor chip 420. In some embodiments, the first package substrate 110, the first semiconductor chip 120, the interposer 200, the heat dissipation layer 310, the second package substrate 410, and the second semiconductor chip 420 may be sequentially arranged in a vertical direction.

In some embodiments, the first package substrate 110 may include a printed circuit board. For example, the first package substrate 110 may include a multi-layer printed circuit board.

According to some embodiments, the first package substrate 110 may include a redistribution structure including a redistribution line, a redistribution via, and a redistribution insulating layer surrounding the redistribution line and the redistribution via.

In some embodiments, the first package substrate 110 may include a first substrate base 112 including at least one material selected from the following: phenol resin, epoxy resin, or polyimide. In some embodiments, the first package substrate 110 may include a first upper substrate pad 114 and a second upper substrate pad 115 arranged on the upper surface of the first substrate base 112, and may include a first lower substrate pad 117 arranged on the lower surface of the first substrate base 112. The first substrate base 112 may include an internal wiring pattern configured to electrically connect the first upper substrate pad 114, the second upper substrate pad 115, and the first lower substrate pad 117 to each other. The internal wiring pattern may include a line pattern 116 extending in a horizontal direction and a via pattern 118 extending in a vertical direction in the first substrate base 112.

For example, the first upper substrate pad 114, the second upper substrate pad 115, the first lower substrate pad 117, the line pattern 116, and the via pattern 118 may include a metal, such as copper (Cu), aluminum (Al), tungsten (W), titanium (Ti), indium (In), molybdenum (Mo), manganese (Mn), cobalt (Co), tin (Sn), nickel (Ni), magnesium (Mg), rhenium (Re), beryllium (Be), gallium (Ga), and ruthenium (Ru), an alloy thereof, or a combination thereof.

In some embodiments, the first package substrate 110 may include a substrate upper protective layer 113 arranged to expose the first upper substrate pad 114 and the second upper substrate pad 115 and cover the upper surface of the first substrate base 112, and a substrate lower protective layer 111 arranged to expose the first lower substrate pad 117 and cover the lower surface of the first substrate base 112. For example, the substrate upper protective layer 113 and the substrate lower protective layer 111 may be provided as solder resist.

In some embodiments, the first upper substrate pad 114 may include a pad to which a first chip connection bump 124, such as a micro-bump, is attached, and the second upper substrate pad 115 may include a pad to which a first conductive connector 128 is attached. The first chip connection bump 124 may be connected to the first upper substrate pad 114 via a first opening provided in the substrate upper protective layer 113. The first conductive connector 128 may be connected to the second upper substrate pad 115 via a second opening provided on the substrate upper protective layer 113.

In some embodiments, the first lower substrate pad 117 may function as a pad to which an external connection terminal 119 is attached. The external connection terminal 119 may be connected to the first lower substrate pad 117 via an opening provided in the substrate lower protective layer 111. The external connection terminal 119 may include, for example, a solder ball. The external connection terminal 119 may electrically and physically connect the semiconductor package 1000 to an external device.

In some embodiments, at least one passive element 134 may be attached to the lower surface of the first package substrate 110. The passive element 134 may include a surface-mount device (SMD). For example, the passive element 134 may include a capacitor or a resistor. A terminal portion of the passive element 134 may be electrically connected to the first lower substrate pad 117 via a connection terminal 132. In some embodiments, the passive element 134 may also be buried in the first package substrate 110.

According to some embodiments, the first semiconductor chip 120 may be mounted on the first package substrate 110. For example, the first semiconductor chip 120 may be arranged between the first package substrate 110 and the interposer 200 in a direction perpendicular to the upper surface of the first package substrate 110.

In some embodiments, the first semiconductor chip 120 may include a semiconductor substrate having an active surface and an inactive surface opposite to each other. The semiconductor substrate may include silicon, for example, crystalline silicon, polycrystalline silicon, or amorphous silicon. The first semiconductor chip 120 may include a semiconductor device layer formed on the active surface of the semiconductor substrate. The first semiconductor chip 120 may include upper and lower surfaces opposite to each other, and a first chip pad 122 may be provided on the lower surface of the first semiconductor chip 120. The lower surface of the first semiconductor chip 120 may be a surface adjacent to the active surface of the semiconductor substrate, and the upper surface of the first semiconductor chip 120 may be a surface adjacent to the inactive surface of the semiconductor substrate. The first chip pad 122 may be electrically connected to the semiconductor device layer via a wiring structure (not illustrated) provided inside the first semiconductor chip 120.

In some embodiments, the first semiconductor chip 120 may include, as a memory chip, a volatile memory chip and/or a non-volatile memory chip. The volatile memory chip may include, for example, dynamic random access memory (RAM) (DRAM), static RAM (SRAM), thyristor RAM (TRAM), zero capacitor RAM (ZRAM), or twin transistor RAM (TTRAM). In addition, the non-volatile memory chip may include, for example, flash memory, magnetic RAM (MRAM), spin-transfer-torque MRAM (STT-MRAM), ferroelectric RAM (FRAM), phase change RAM (PRAM), nanotube RRAM, polymer RAM, or an insulator resistance change memory, etc.

In some embodiments, the first semiconductor chip 120 may include a non-memory chip. For example, the first semiconductor chip 120 may include, as a logic chip, an artificial intelligence semiconductor, a microprocessor, a graphics processor, a signal processor, a network processor, a chipset, an audio codec, a video codec, and an application processor.

In some embodiments, the first semiconductor chip 120 may be mounted on the first package substrate 110 in a face-down method or a flip-chip method. For example, the first semiconductor chip 120 may be mounted on the first package substrate 110 such that the lower surface of the first semiconductor chip 120 provided with the first chip pad 122 faces the first package substrate 110. The first chip pad 122 may be electrically connected to the first upper substrate pad 114 via the first chip connection bump 124. The first chip pad 122 may be used as a terminal for transmitting input/output data signals of the first semiconductor chip 120, or as a terminal for power and/or ground of the first semiconductor chip 120.

In some embodiments, an underfill material layer 126 configured to surround or be on a sidewall of the first chip connection bump 124 may be filled between the first semiconductor chip 120 and the first package substrate 110. For example, the underfill material layer 126 may include epoxy resin formed by a capillary under-fill method. In some embodiments, the underfill material layer 126 may include a non-conductive film. However, in some embodiments, an insulating filler 129 may also be directly filled into a gap between the first semiconductor chip 120 and the first package substrate 110 by using a molded underfill method. In this case, the underfill material layer 126 may be omitted.

The interposer 200 may be on the first package substrate 110 and the first semiconductor chip 120. In some embodiments, the interposer 200 may include a printed circuit board. For example, the interposer 200 may include a multi-layer printed circuit board. In some other embodiments, the interposer 200 may have a wiring structure including a rewiring line, a rewiring via, and a rewiring insulating layer on a sidewall of the rewiring line and the rewiring via.

In some embodiments, the interposer 200 may include an interposer substrate 202, an upper protective insulating layer 204, a lower protective insulating layer 206, and a wiring structure 210. The interposer substrate 202 may include at least one material selected from phenol resin, epoxy resin, and polyimide. For example, the interposer substrate 202 may include at least one material selected from polyimide, flame retardant 4 (FR-4), tetrafunctional epoxy, polyphenylene ether, epoxy/polyphenylene oxide, bismaleimide triazine (BT), thermount, cyanate ester, and liquid crystal polymer. In some other embodiments, the interposer substrate 202 may also include silicon (Si), for example, crystalline silicon, polycrystalline silicon, or amorphous silicon.

The wiring structure 210 may include an upper conductive pad 212 on the upper surface of the interposer substrate 202, a lower conductive pad 214 on the lower surface of the interposer substrate 202, and a conductive via 216 extending into the interposer substrate 202. The upper conductive pad 212 may include a pad to which a connector, such as a solder ball, is attached. The lower conductive pad 214 may include a pad to which a first conductive connector 128 for electrically connecting between the first package substrate 110 and the interposer 200 is attached. The conductive via 216 may contact both the upper conductive pad 212 and the lower conductive pad 214, and may be configured to electrically connect the upper conductive pad 212 to the lower conductive pad 214.

The wiring structure 210 may include a metal, such as copper (Cu), aluminum (Al), tungsten (W), titanium (Ti), tantalum (Ta), indium (In), molybdenum (Mo), manganese (Mn), cobalt (Co), tin (Sn), nickel (Ni), magnesium (Mg), rhenium (Re), beryllium (Be), gallium (Ga), and ruthenium (Ru), an alloy thereof, or a combination thereof.

The upper protective insulating layer 204 may be on the upper surface of the interposer substrate 202, and the lower protective insulating layer 206 may be on the lower surface of the interposer substrate 202. The upper protective insulating layer 204 may be configured to cover the upper surface of the interposer substrate 202, and may include an upper opening for exposing the upper conductive pad 212. The lower protective insulating layer 206 may be configured to cover the lower surface of the interposer substrate 202, and may include a lower opening for exposing the lower conductive pad 214. For example, an upper protective insulating layer 204 and a lower protective insulating layer 206 may include solder resist.

The first conductive connector 128 may electrically connect the interposer 200 to the first package substrate 110. The first conductive connector 128 may be spaced apart from the sidewall of the first semiconductor chip 120 in a horizontal direction, and may have a column shape extending between the first package substrate 110 and the interposer 200. The lower portion of the first conductive connector 128 may contact the second upper substrate pad 115 of the first package substrate 110, and the upper portion of the first conductive connector 128 may contact the lower conductive pad 214 of the interposer 200. The first conductive connector 128 may include, for example, a conductive material, such as a solder and copper (Cu).

The insulating filler 129 may be provided on the first package substrate 110. The insulating filler 129 may be filled between the first package substrate 110 and the interposer 200. The insulating filler 129 may protect the first package substrate 110, the first semiconductor chip 120, the first conductive connector 128, and the interposer 200 from an external environment. The insulating filler 129 may be formed to cover at least a portion of each of the first package substrate 110, the first semiconductor chip 120, the first conductive connector 128, and the interposer 200. For example, the insulating filler 129 may cover the upper surface of the first package substrate 110, the sidewall of the first semiconductor chip 120, the upper surface of the first semiconductor chip 120, and the lower surface of a lower insulating protective layer 206 of the interposer 200. In addition, the insulating filler 129 may be filled in a gap between the lower surface of the lower insulating protective layer 206 of the interposer 200 and the upper surface of the first semiconductor chip 120.

In some embodiments, to form the insulating filler 129, a supply process of supplying an insulating filling material constituting the insulating filler 129 between the first package substrate 110 and the interposer 200, and a curing process of curing the insulating filling material may be performed.

In some embodiments, the insulating filler 129 may include an epoxy-based molding resin, a polyimide-based molding resin, etc. For example, the insulating filler 129 may include an epoxy molding compound (EMC).

According to embodiments, the second package 400 may be on the interposer 200. In some embodiments, a second package substrate 410 may include a printed circuit board. The second package substrate 410 may include a second substrate base 412 including at least one material selected from epoxy resin and polyimide. The second package substrate 410 may include a third upper substrate pad 414 on the upper surface of the second substrate base 412 and a second lower substrate pad 416 on the lower surface of the second substrate base 412. The second substrate base 412 may include an internal wiring configured to electrically connect the third upper substrate pad 414 to the second lower substrate pad 416.

In some embodiments, the second package substrate 410 may be mounted on the interposer 200 via a second conductive connector 418 on the upper conductive pad 212 of the interposer 200. The second conductive connector 418 may electrically connect the upper conductive pad 212 of the interposer 200 to the second lower substrate pad 416 of the second package substrate 410. In some embodiments, the second conductive connector 418 may include a conductive material, such as solder and Cu. For example, the second conductive connector 418 may have a ball shape, and accordingly, may be referred to as a solder ball.

In some embodiments, the second semiconductor chip 420 may be on the second package substrate 410. In some embodiments, a second chip pad 422 of the second semiconductor chip 420 may be electrically connected to the third upper substrate pad 414 of the second package substrate 410 via a second chip connection bump 424. An underfill material layer 426 on a sidewall of or surrounding the second chip connection bump 424 may be between the second semiconductor chip 420 and the second package substrate 410. In some embodiments, the second semiconductor chip 420 may also be electrically connected to the second package substrate 410 via a bonding wire.

In some embodiments, the first semiconductor chip 120 and the second semiconductor chip 420 may include the same type of semiconductor chip. In some embodiments, the first semiconductor chip 120 and the second semiconductor chip 420 may include the different types of semiconductor chips. For example, when the first semiconductor chip 120 includes a logic chip, the second semiconductor chip 420 may include a memory chip. In some embodiments, the second semiconductor chip 420 may be implemented as a high bandwidth memory (HBM) memory chip. In some embodiments, the semiconductor package 1000 may be configured to operate as a single system by electrically connecting components, such as different types of semiconductor chips and passive devices, to each other.

In some embodiments, a molding layer 439 may be on the second package substrate 410 to cover at least a portion of the second semiconductor chip 420. For example, the molding layer 439 may include an epoxy-based molding resin or a polyimide-based molding resin. For example, the molding layer 439 may include an EMC.

According to embodiments, the heat dissipation layer 310 may be directly on the upper surface of the interposer 200. For example, the heat dissipation layer 310 may be directly on the upper surface of the solder resist. According to embodiments, the heat dissipation layer 310 may be attached to the upper surface of the interposer 200 by using an adhesive layer 320. For example, the adhesive layer 320 may also be between the heat dissipation layer 310 and the interposer 200. The heat dissipation layer 310 may be on the first semiconductor chip 120 and under the second semiconductor chip 420, and be configured to emit heat generated by the first and second semiconductor chips 120 and 420. Accordingly, overheating of the first semiconductor chip 120 and the second semiconductor chip 420 may be prevented, and operational reliability and life characteristics may be improved.

According to some embodiments, the heat dissipation layer 310 may include a metal material. For example, the heat dissipation layer 310 may include a metal, such as Cu, Al, or a combination thereof. However, the example embodiments are not limited thereto, and a carbon-based material, such as carbon black and graphite, may be included as a heat-dissipating material having high thermal conductivity.

According to embodiments, a first projection 140, which is a shadow formed when the first semiconductor chip 120 is projected on a plane including the heat dissipation layer 310, and a second projection 440, which is a shadow formed when the second semiconductor chip 420 is projected on a plane including the heat dissipation layer 310, may be defined. For example, the first projection 140 and the second projection 440 may be orthogonal projections on a plane including the heat dissipation layer 310 of the first semiconductor chip 120 and the second semiconductor chip 420, respectively. Accordingly, the first projection 140 and the second projection 440 are spaced apart from each other horizontally and do not overlap each other in the vertical or Z direction.

According to embodiments, the first projection 140 and the second projection 440 may not overlap each other. For example, the first semiconductor chip 120 and the second semiconductor chip 420 may be configured not to overlap vertically (that is, in the Z direction), and the first projection 140 and the second projection 440 may be horizontally spaced apart from each other (that is, in the X direction and/or Y direction).

According to embodiments, the heat dissipation layer 310 may include a first portion 312, which at least partially overlaps the first projection 140, and a second portion 314, which at least partially overlaps the second projection 440. For example, the first portion 312 may be on or above the first semiconductor chip 120, and the second portion 314 may be under or below the second semiconductor chip 420. For example, the first portion 312 may be a portion of the heat dissipation layer 310, which is the main heat dissipation medium of the first semiconductor chip 120, and the second portion 314 may be a portion of the heat dissipation layer 310, which is the main heat dissipation medium of the second semiconductor chip 420.

According to embodiments, the heat dissipation layer 310 may have a planar shape including a gap G. For example, the gap G may be a space or void in which the heat dissipation layer 310 is absent from regions on the interposer 200 and under the second package substrate 410.

In some embodiments, the first portion 312 and the second portion 314 may be at least partially spaced apart from each other, and a first gap G1, which is a space between the first portion 312 and the second portion 314, may be formed. For example, the first gap G1 may be a portion of a space defined as the gap G.

According to embodiments, the first portion 312 and the second portion 314 may be horizontally spaced apart from each other (that is, in the X direction and the Y direction), respectively. According to embodiments, the first portion 312 may be positioned around an outer boundary or perimeter of the second portion 314 with the first gap G1 therebetween. According to embodiments, the second portion 314 may have a shape such as an island-shape separated from the inside of an inner boundary B1I of the first portion 312. In this case, heat from the first semiconductor chip 120 emitted via the first portion 312 may be prevented from being conducted to the second portion 314, and furthermore, an amount of heat of the first semiconductor chip 120 transferred to the second semiconductor chip 420 may be reduced. Similarly, an amount of heat transferred to the first semiconductor chip 120 from the heat generated by the second semiconductor chip 420 may be reduced, and accordingly, thermal interference between the first semiconductor chip 120 and the second semiconductor chip 420 may be reduced. In this case, temperatures of the first portion 312 and the second portion 314 may be different from each other during an operation of the first and second semiconductor chips 120 and 420.

In some embodiments, the heat dissipation layer 310 may cover the entire upper surface of the interposer 200 except for an area, in which the gap G is formed. In some embodiments, the first portion 312 may be the remaining portion of the heat dissipation layer 310 except for the second portion 314. Accordingly, heat of the first semiconductor chip 120 concentrated on a portion overlapping the first projection 140 of the first portion 312 may be induced to be dispersed in a horizontal direction (that is, the X direction or the Y direction).

In some embodiments, the second portion 314 may be configured to disperse heat generated by the second semiconductor chip 420 in a vertical direction (that is, the Z direction). For example, heat of the second semiconductor chip 420 may be transferred to the second portion 314 of a lower portion of the second semiconductor chip 420, and the heat transferred to the second portion 314 may be dispersed again by being transferred to a member, such as the lower interposer 200 thereunder.

For example, heat generated by the first semiconductor chip 120 may be transferred to a portion of the first portion 312 overlapping the first projection 140, and may be transferred to the first portion 312.

In some embodiments, the first portion 312 may include the first projection 140 therein in a plan view. For example, the first portion 312 may have a plan area greater than a plan area of the first projection 140, and a boundary of the first projection 140 may be included in the first portion 312. In this case, the first projection 140 may completely overlap the first portion 312.

In some embodiments, the second portion 314 may include the second projection 440 therein in a plan view. For example, the second portion 314 may have a plan area greater than a plan area of the second projection 440, and an outer boundary of the second projection 440 may be within an outer boundary B2O of the second portion 314. In this case, the second projection 440 may completely overlap the second portion 314.

In some embodiments, the second portion 314 may be inside the second projection 440 in a plan view. For example, the second portion 314 may have a plan area less than the plan area of the second projection 440, and the outer boundary B2O of the second portion 314 may be included in the second projection 440 in a plan view. In this case, the second projection 440 may not overlap the first portion 312, and the boundary of the second projection 440 may be in an area, in which the first gap G1 is formed along planes including the heat dissipation layer 310. In some embodiments, the outer boundary B2O of the second portion 314 may also be substantially the same as the boundary of the second projection 440.

In some embodiments, the second portion 314 may also only partially overlap the second projection 440. For example, the second portion 314 may include a portion overlapping the second projection 440 and a portion not overlapping the second projection 440, and the boundary of the second projection 440 may include a portion in an area, in which the gap G is formed, and a portion overlapping the second portion 314.

According to embodiments, the second conductive connector 418 may be positioned in the first gap G1. For example, a plurality of second conductive connectors 418 may be configured to surround or be positioned around a perimeter of the second portion 314 in a space between the first portion 312 and the second portion 314. For example, a plurality of upper conductive pads 212 may be exposed at the upper surface of the interposer 200 via the first gap G1, and a plurality of second conductive connectors 418 may be in the first gap G1 and respectively connect the plurality of upper conductive pads 212 to the second lower substrate pads 416.

According to embodiments, an upper surface 310U of the heat dissipation layer 310 may be at a level vertically lower than a lower surface 410L of the second package substrate 410. For example, the upper surface 310U of the heat dissipation layer 310 may be vertically spaced apart from the lower surface 410L of the second package 400.

Figure 3:
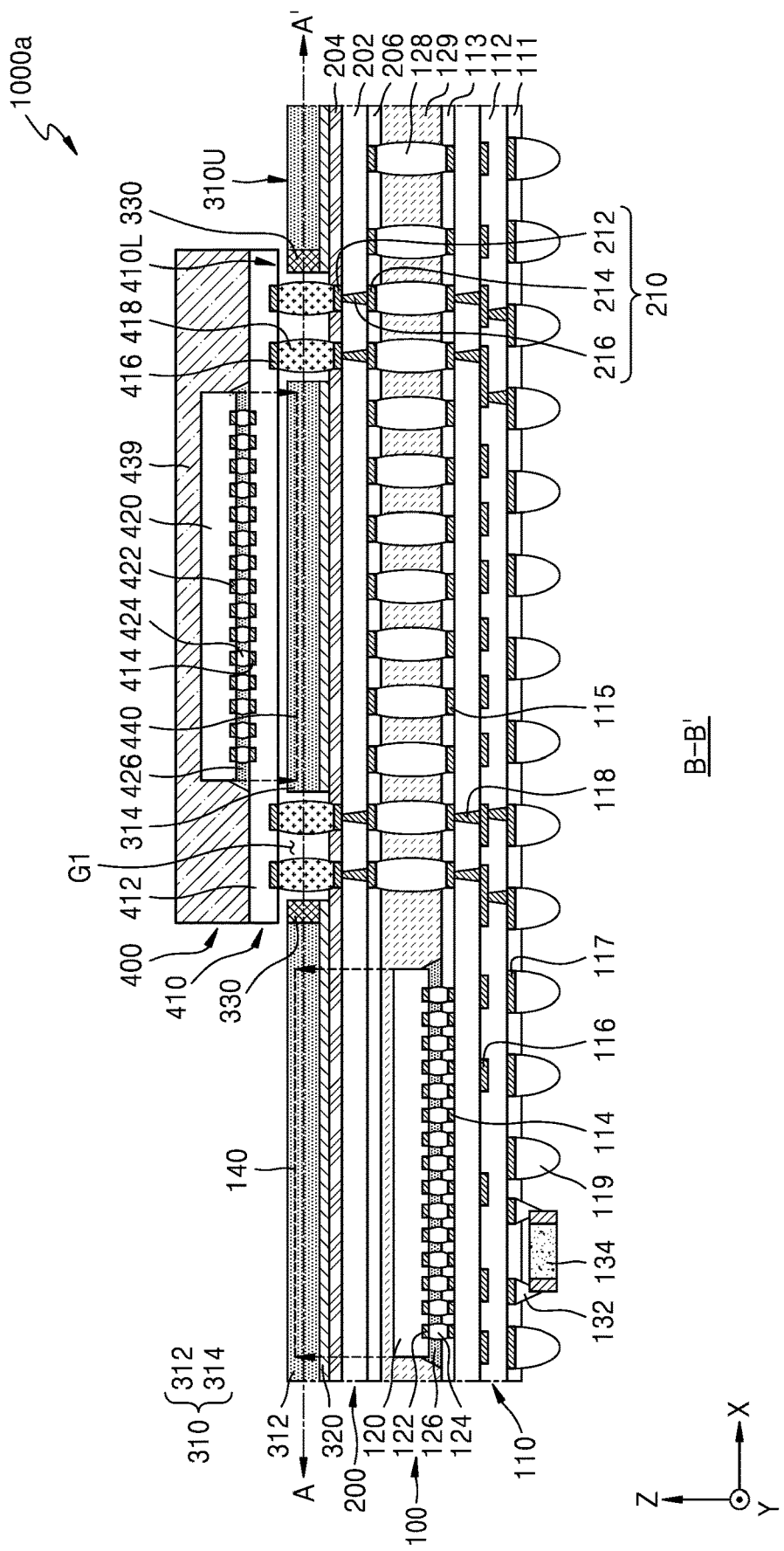
FIG. 3 is a cross-sectional view of a semiconductor package according to an example embodiment.
Figure 4:
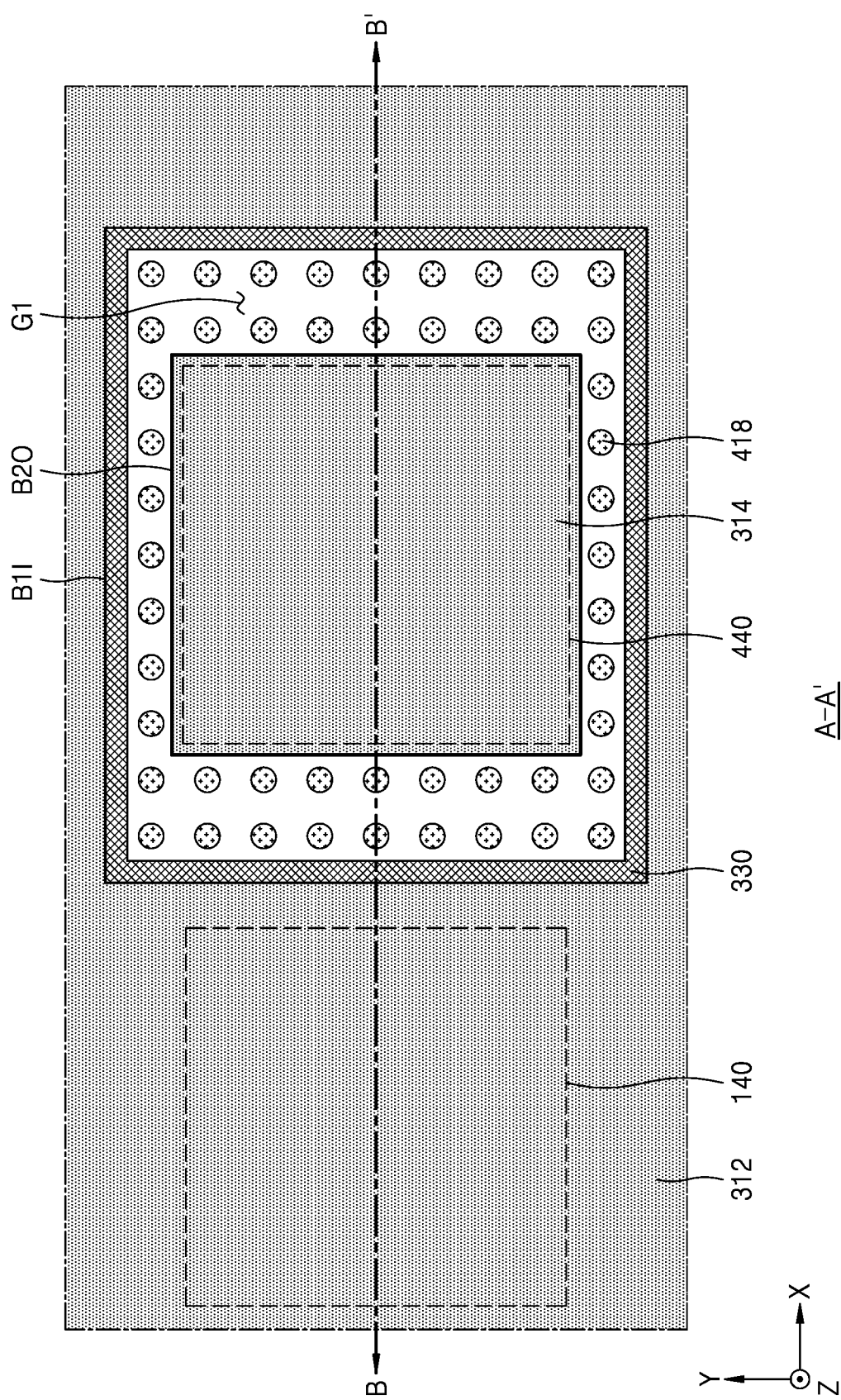
FIG. 4 is a planar view of the semiconductor package of FIG. 3 taken at a line A-A' of FIG. 3.

FIG. 3 is a cross-sectional view of a semiconductor package 1000a according to an example embodiment. FIG. 4 is a planar view of the semiconductor package of FIG. 3 at a line A-A' of FIG. 3. A difference between FIGS. 1A and 3 and a difference between FIGS. 2 and 4 is whether a heat insulating pattern 330 is included. Hereinafter, the differences are mainly described.

Referring to FIGS. 3 and 4, the heat dissipation layer 310 may further include the heat insulating pattern 330 configured to reduce heat transfer in a horizontal direction. According to embodiments, the heat insulating pattern 330 may be between a portion of the heat dissipation layer 310 overlapping the first projection 140 and a portion of the heat dissipation layer 310 overlapping the second projection 440. In other words, the heat insulating pattern 330 may be between a portion of the heat dissipation layer 310 closest to the first semiconductor chip 120 and a portion of the heat dissipation layer 310 closest to the second semiconductor chip 420. In this case, heat transfer in a horizontal direction between a portion of the heat dissipation layer 310 overlapping the first projection 140 and a portion of the heat dissipation layer 310 overlapping the second projection 440 may be reduced.

According to embodiments, the heat insulating pattern 330 may include a material having relatively low thermal conductivity than a material constituting the heat dissipation layer 310. For example, the heat insulating pattern 330 may include a dielectric material having low thermal conductivity. For example, the heat insulating pattern 330 may include a silicon-based polymer, such as polydimethylsiloxane, polyorganosiloxane, and polytetrafluoroethylene, a polyimide-based polymer, a polyurethane-based polymer, or a combination thereof.

According to embodiments, the heat insulating pattern 330 may be at the inner boundary B1I of the first portion 312. According to embodiments, the heat insulating pattern 330 may extend along the inner boundary B1I of the first portion 312, and may be configured to surround or be positioned around an outer boundary or perimeter of the second portion 314. For example, the heat insulating pattern 330 may be configured to surround or be positioned around an outer boundary or perimeter of the outer boundary B2O of the second portion 314 by being spaced apart from the outer boundary B2O of the second portion 314 with the first gap G1 therebetween, and the first portion 312 may be configured to contact the heat insulating pattern 330 and be positioned around an outer boundary or perimeter of the heat insulating pattern 330.

Figure 5:
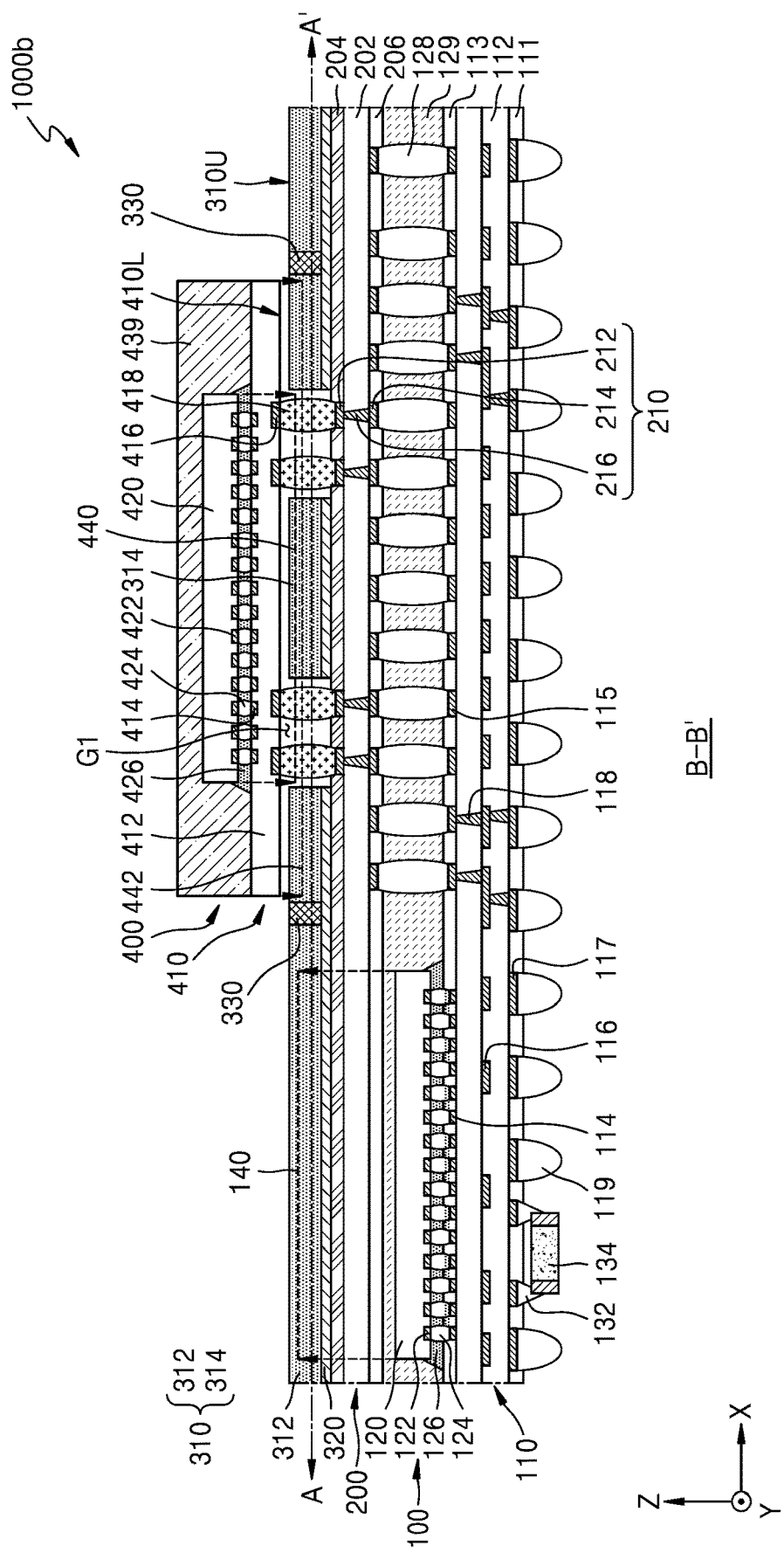
FIG. 5 is a cross-sectional view of a semiconductor package according to an example embodiment.
Figure 6:
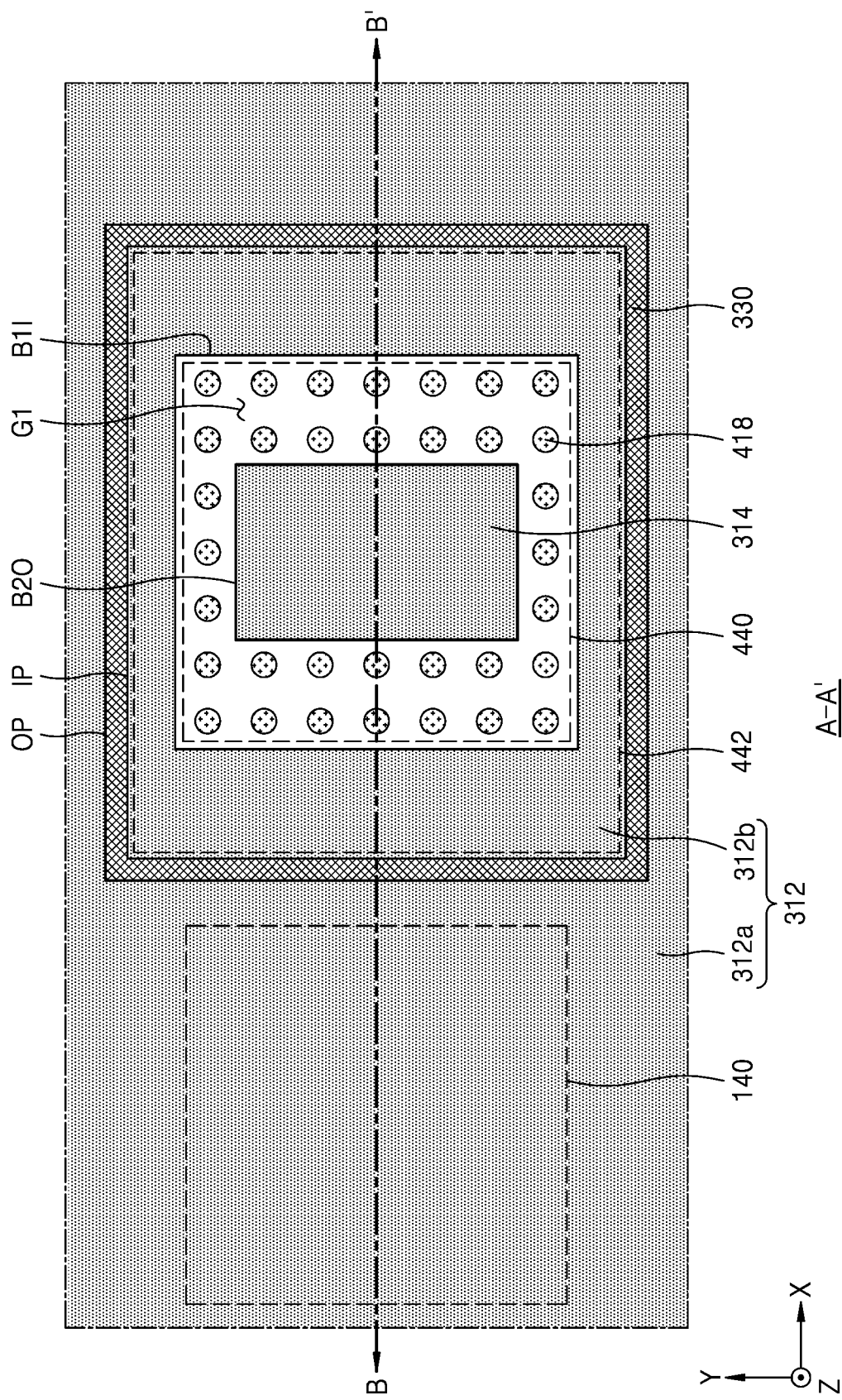
FIG. 6 is a planar view of the semiconductor package of FIG. 5 taken at a line A-A' of FIG. 5.

FIG. 5 is a cross-sectional view of a semiconductor package 1000b according to an example embodiment. FIG. 6 is a planar view of the semiconductor package of FIG. 5 at a line A-A' of FIG. A difference between FIGS. 3 and 5 and a difference between FIGS. 4 and 6 is whether the heat insulating pattern 330 is inside the first portion 312. Hereinafter, the differences are mainly described.

Referring to FIGS. 5 and 6, the heat insulating pattern 330 may be inside the first portion 312. For example, the heat insulating pattern 330 may be spaced apart from the inner boundary B1I of the first portion 312 by a certain distance, in a direction away from the second projection 440. The heat insulating pattern 330 may extend between a portion of the heat dissipation layer 310 overlapping the first projection 140 and a portion of the heat dissipation layer 310 overlapping the second projection 440. In some embodiments, the heat insulating pattern 330 may be spaced apart from the inner boundary B1I of the first portion 312 by a certain distance, and may be configured to surround be positioned around an outer boundary or perimeter of the second portion 314.

According to embodiments, a third projection 442, which is a shadow formed when the second package substrate 410 is projected on a plane including the heat dissipation layer 310, may be defined. For example, the third projection 442 may be an orthogonal projection of the second package substrate 410 on a plane including the heat dissipation layer 310. For example, the third projection 442 may be substantially the same as the orthogonal projection on a plane including the heat dissipation layer 310 of the second package 400.

According to embodiments, the first portion 312 may be configured to at least partially overlap the third projection 442. According to embodiments, an inner boundary IP of the heat insulating pattern 330 may include the third projection 442 therein in a plan view. According to embodiments, the heat insulating pattern 330 may be spaced apart from the inner boundary B1I of the first portion 312 by a certain distance and may be configured to surround be positioned around an outer boundary or perimeter of the third projection 442. For example, a boundary of the third projection 442 may be in an area between the inner boundary IP of the heat insulating pattern 330 and the inner boundary B1I of the first portion 312. In this case, the first portion 312 and the first gap G1 may be inside the boundary of the third projection 442.

In some embodiments, the heat insulating pattern 330 may also substantially overlap the boundary of the third projection 442. For example, the inner boundary IP or an outer boundary OP of the heat insulating pattern 330 may be substantially the same as the boundary of the third projection 442.

According to embodiments, the heat insulating pattern 330 may function as a heat insulating wall for reducing thermal interference between the first package 100 and the second package 400. According to embodiments, the heat insulating pattern 330 may be configured to prevent thermal conduction to a portion of the first portion 312, which overlaps the first projection 140 and a portion of the first portion 312, which overlaps the third projection 442. In this case, heat transfer between the portion of the first portion 312 overlapping the third projection 442 and the second package 400 may be reduced. Accordingly, thermal interference between the first semiconductor chip 120 and the second semiconductor chip 420 may be reduced. For example, heat of the first semiconductor chip 120 concentrated on a portion overlapping the first projection 140 of the first portion 312 may be prevented from being transferred to the second semiconductor chip 420 primarily by the heat insulating pattern 330, and secondarily by the first gap G1.

Figure 7:
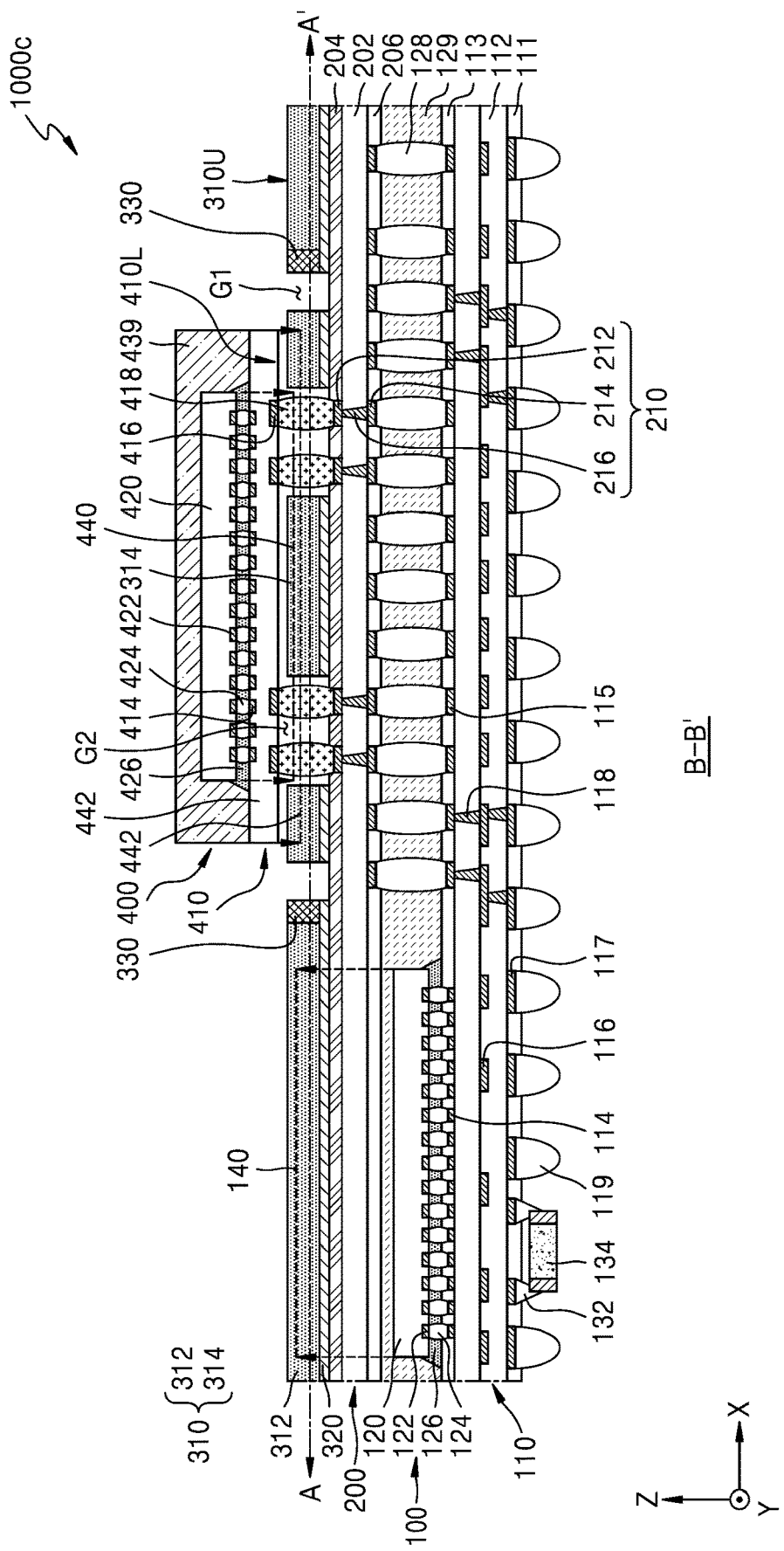
FIG. 7 is a cross-sectional view of a semiconductor package according to an example embodiment.
Figure 8:
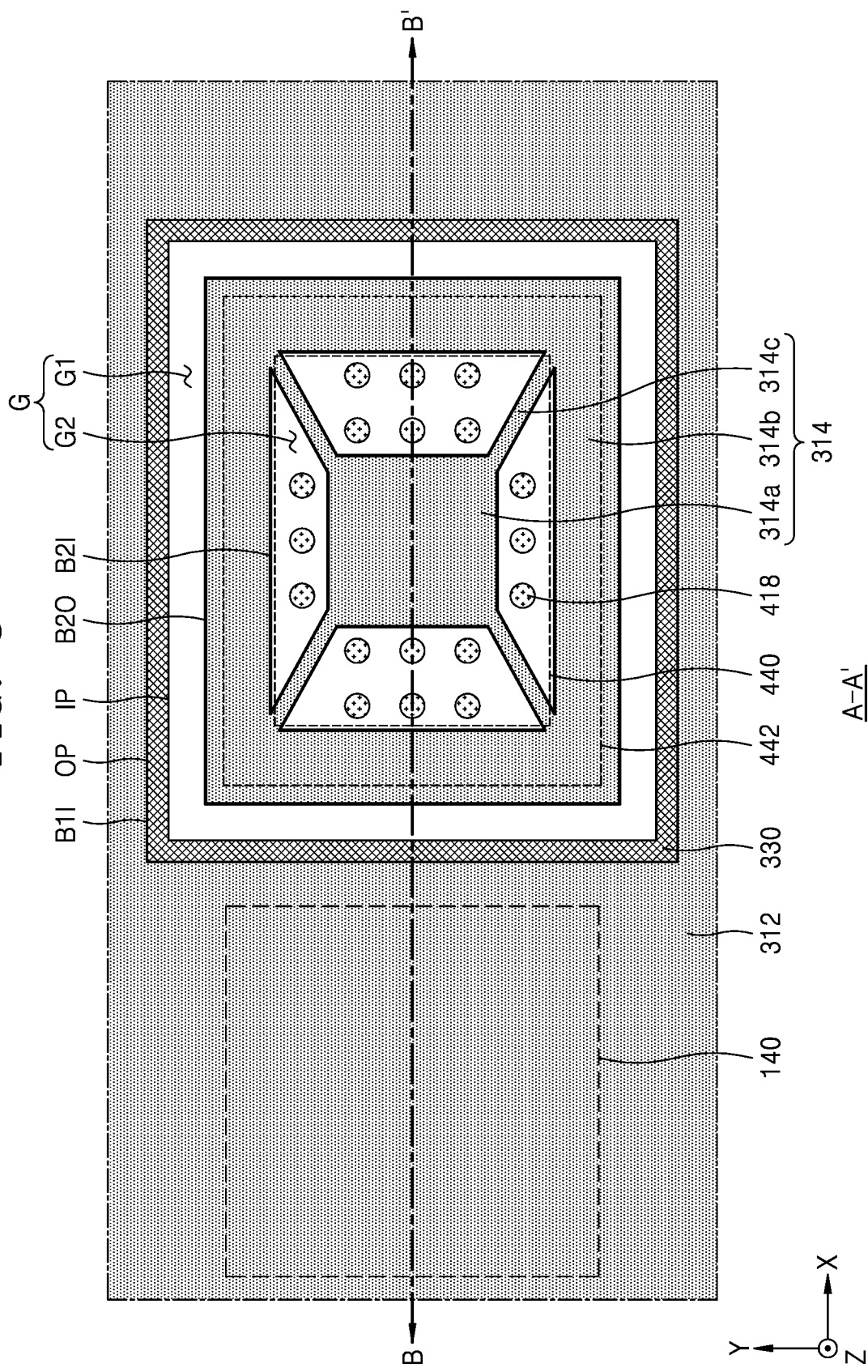
FIG. 8 is a planar view of the semiconductor package of FIG. 7 taken at a line A-A' of FIG. 7.

FIG. 7 is a cross-sectional view of a semiconductor package 1000c according to an embodiment. FIG. 8 is a planar view of the semiconductor package of FIG. Tat a line A-A' of FIG. 7. A difference between FIGS. 3 and 7 and a difference between FIGS. 4 and 8 may be the shape of the second portion 314 and whether the plurality of second conductive connectors 418 are in the first gap G1. Hereinafter, the differences are mainly described.

Referring to FIGS. 7 and 8, the second portion 314 may include a second gap G2 therein. In some embodiments, the second gap G2 may have a shape vertically extending into a portion of the second portion 314. In some embodiments, the second gap G2 may be a space or gap in which the heat dissipation layer 310 is not in the spaces on the interposer 200 and under the second package substrate 410, and may be a space horizontally defined by an inner boundary B2I of the second part 314. For example, the second gap G2 may include a portion of a space defined as the gap G.

According to embodiments, the second portion 314 may include a center portion 314a overlapping the second projection 440 and an edge portion 314b spaced apart in an outer direction from the center portion 314a and surrounding or being positioned around an outer boundary or perimeter of the center portion 314a. In this case, the second gap G2 may include a space between the center portion 314a and the edge portion 314b. According to embodiments, the center portion 314a and the edge portion 314b may be connected to each other by a connection line 314c. In some embodiments, the center portion 314a, the edge portion 314b, and the connection line 314c may be formed in one body. According to embodiments, the plurality of second conductive connectors 418 may be in the second gap G2. For example, the plurality of upper conductive pads 212 may be exposed at the upper surface of the interposer 200 via the second gap G2, and the plurality of second conductive connectors 418 may be in the second gap G2 and respectively connect the plurality of upper conductive pads 212 to the second lower substrate pads 416.

According to embodiments, the edge portion 314b may be configured to surround or be positioned around an outer boundary or perimeter of the second projection 440. For example, the center portion 314a may be arranged within the boundary of the second projection 440 in a plan view, and the boundary of the second projection 440 may be in an area, where the second gap G2 between the center portion 314a and the edge portion 314b is formed. In this case, the boundary of the second projection 440 may partially overlap the connection line 314c. For example, the center portion 314a of the second portion 314 may include a portion closest to the second semiconductor chip 420. For example, the heat of the second semiconductor chip 420 transferred to the center portion 314a may be conducted to the edge portion 314b outside the plurality of second conductive connectors 418 horizontally surrounding (e.g., being positioned around an outer boundary or perimeter of) the center portion 314a via the connection line 314c, and may promote heat dispersion of the second portion 314 in a horizontal direction.

According to embodiments, the edge portion 314b may at least partially overlap the third projection 442. For example, the outer boundary of the edge portion 314b may be substantially the same as the outer boundary B2O of the second portion 314, and the edge portion 314b of the second portion 314 may be include the boundary of the third projection 442 therein in a plan view. For example, the edge portion 314b may also be configured such that the outer boundary of the edge portion 314b is substantially the same as the third projection 442.

In some embodiments, the second portion 314 may be inside the third projection 442 in a plan view. In this case, the boundary of the third projection 442 may be in an area, where the first gap G1 is formed, and the heat insulating pattern 330 may be configured to extend along the inner boundary B1I of the first portion 312 and surround or be positioned around an outer boundary or perimeter of the third projection 442. In some embodiments, the heat insulating pattern 330 may also be configured to substantially overlap the boundary of the third projection 442. For example, the inner boundary IP or an outer boundary OP of the heat insulating pattern 330 may be substantially the same as the boundary of the third projection 442.

Figure 9:
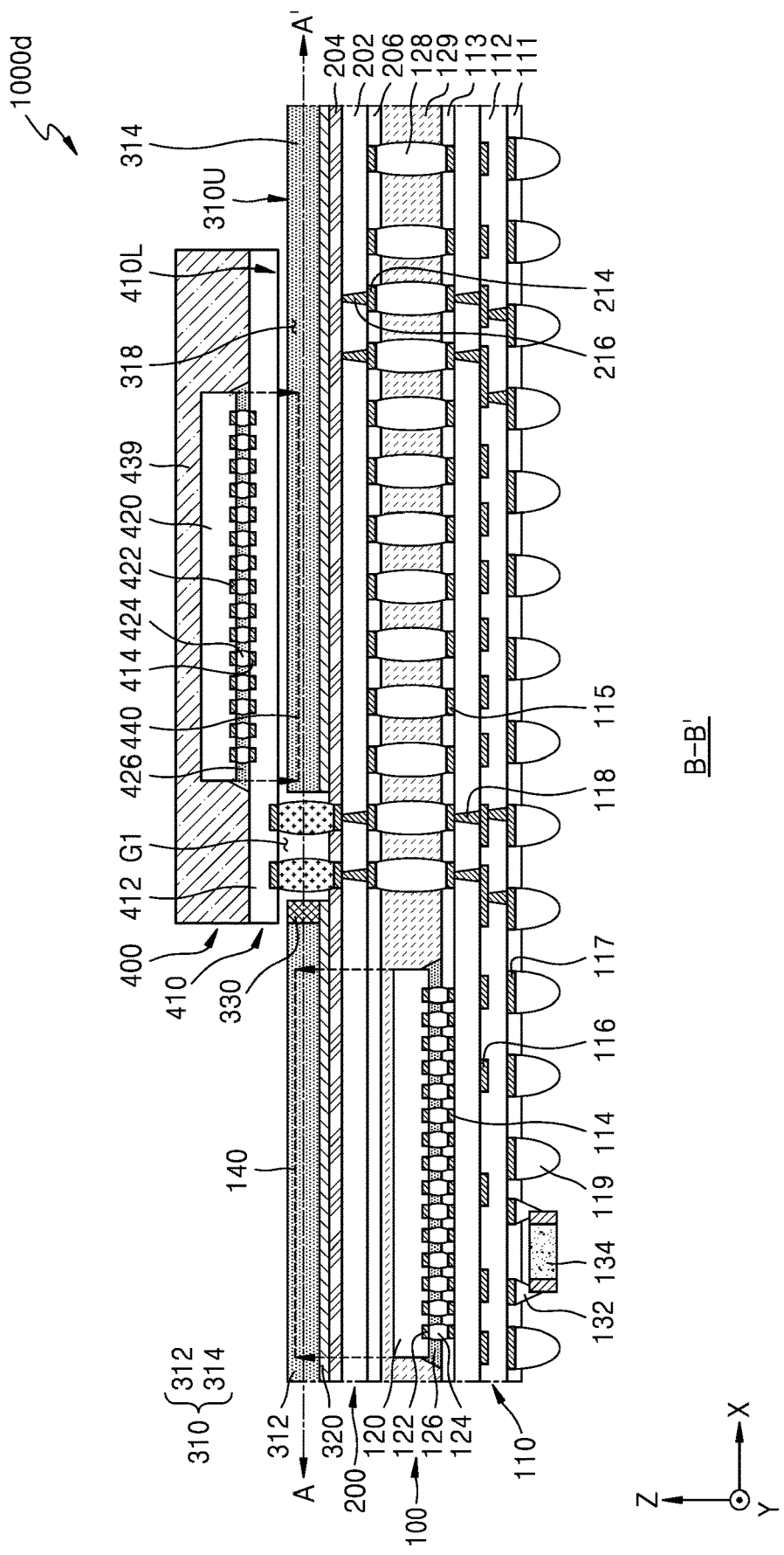
FIG. 9 is a cross-sectional view of a semiconductor package according to an example embodiment.
Figure 10:
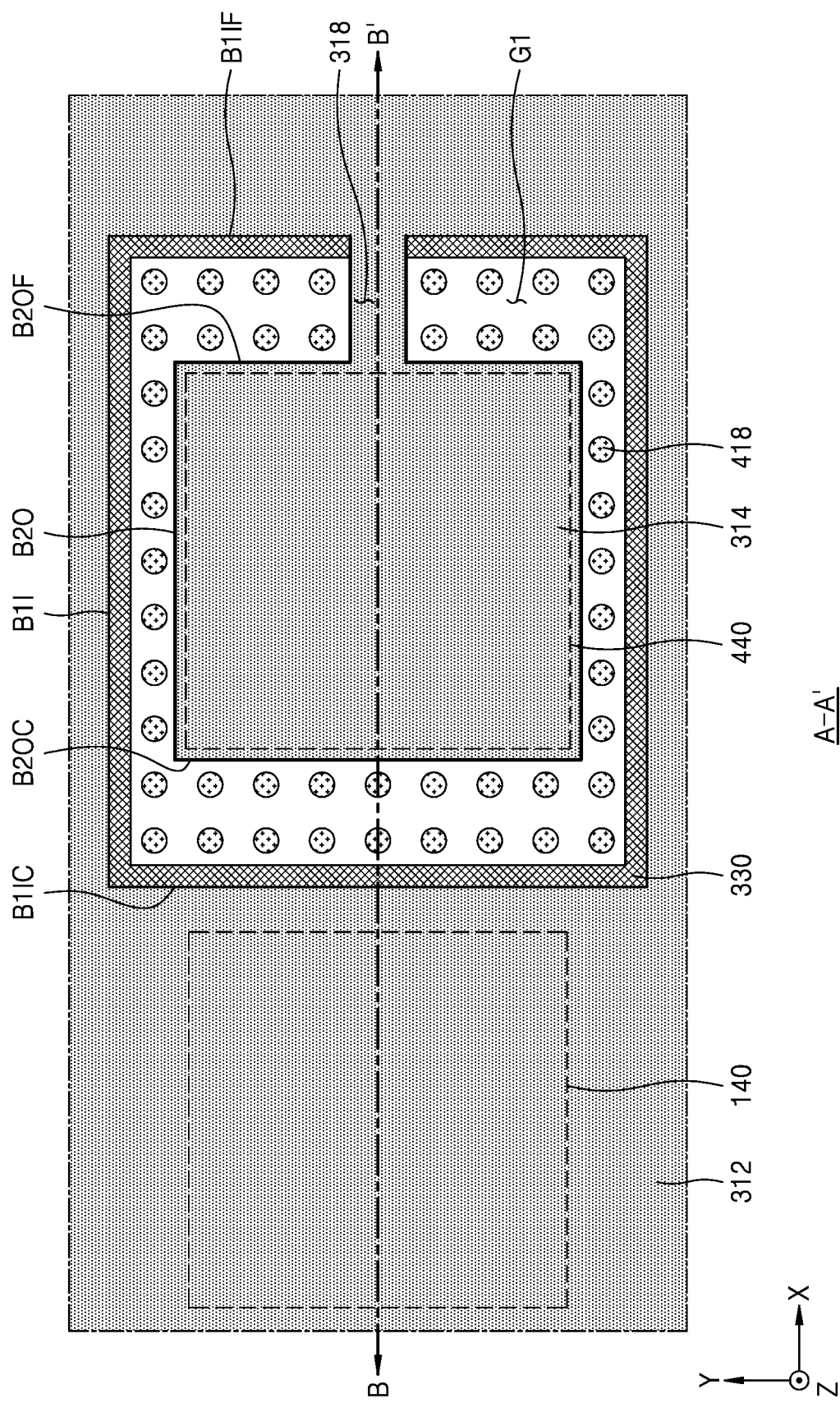
FIG. 10 is planar view of the semiconductor package of FIG. 9 taken at a line A-A' of FIG. 9.

FIG. 9 is a cross-sectional view of a semiconductor package 1000d according to an example embodiment. FIG. 10 is a planar view of the semiconductor package of FIG. 9 at a line A-A' of FIG. 9. A difference between FIGS. 3 and 9 and a difference between FIGS. 4 and 10 may be whether the heat dissipation layer 310 includes a bridge portion 318 connecting the first portion 312 to the second portion 314. Hereinafter, the differences are mainly described.

Referring to FIGS. 9 and 10, the first portion 312 may be configured to surround or be positioned around an outer boundary or perimeter of the second portion 314. According to embodiments, the first portion 312 and the second portion 314 may be at least partially spaced apart from each other. According to embodiments, the first portion 312 and the second portion 314 may include portions thereof spaced apart from each other with the first gap G1 therebetween and portions thereof connected to each other via the bridge portion 318.

In some embodiments, the first portion 312 and the second portion 314 may be spaced apart from each other with the first gap G1 between a first boundary B1IC of the inner boundary B1I of the first portion 312 most adjacent to the first projection 140 and a third boundary B2OC of the outer boundary B2O of the second portion 314 most adjacent to the first projection 140. In some embodiments, at least a portion of a second boundary B1IF of the inner boundary B1I of the first portion 312 farthest from the first projection 140 may be connected to a fourth boundary B2OF of the outer boundary B2O of the second portion 314 farthest from the first projection 140 via the bridge portion 318. In some embodiments, the first portion 312, the second portion 314, and the bridge portion 318 may be formed in one body.

For example, the remaining portion of the first portion 312 except for a portion connected to the second portion 314 via the bridge portion 318 may be configured to surround or be positioned around an outer boundary or perimeter of the second portion 314 with the first gap G1 therebetween.

According to embodiments, the second portion 314 may have a shape such as a moat-shape partially connected to the first portion 312 via the bridge portion 318 inside the inner boundary B1I of the first portion 312. In this case, transferring of the heat of the first semiconductor chip 120 to the second semiconductor chip 420 may be reduced by the first gap G1 near the first boundary B1IC. In addition, the heat of the second semiconductor chip 420 may be dispersed by the bridge portion 318 in a horizontal direction (that is, a direction away from the first semiconductor chip 120). Accordingly, thermal interference between the first semiconductor chip 120 and the second semiconductor chip 420 may be reduced, and heat dissipation in a horizontal direction via the heat dissipation layer 310 of the second semiconductor chip 420 may be further improved.

According to embodiments, the heat insulating pattern 330 may be between the first projection 140 and the second projection 440. According to embodiments, the heat insulating pattern 330 may extend along the remaining portion of the inner boundary B1I of the first portion 312 except for a portion connected to the bridge portion 318, and may be configured to surround or be positioned around an outer boundary or perimeter of the second portion 314 with the first gap G1 therebetween. For example, the heat insulating pattern 330 may have an open-loop shape.

In some embodiments, the boundary of the third projection 442 (refer to FIG. 5), which is a projection of the second package substrate 410, may overlap the first portion 312. In some embodiments, the heat insulating pattern 330 may also be spaced apart by a certain interval from the inner boundary B1I of the first portion 312 in a direction away from the second projection 440, similar to the cases of FIGS. 5 and 6, and may surround (e.g., be positioned around an outer boundary or perimeter of) the third projection 442. In this case, the insulation pattern 330 may have an open-loop shape, in which a portion adjacent to the bridge portion 318 is opened in the first portion 312.

Figure 11:
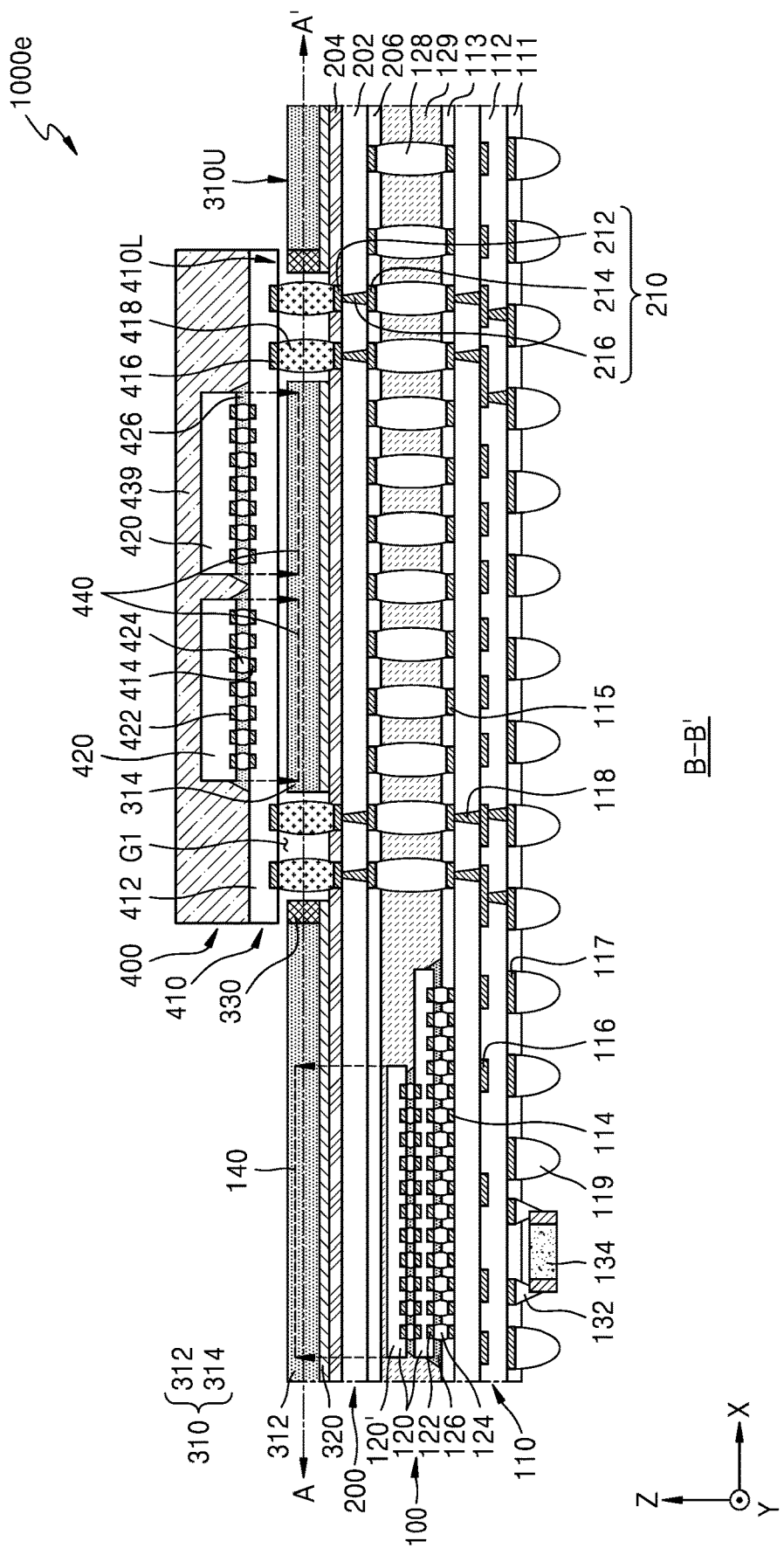
FIG. 11 is a cross-sectional view of a semiconductor package according to an example embodiment.
Figure 12:
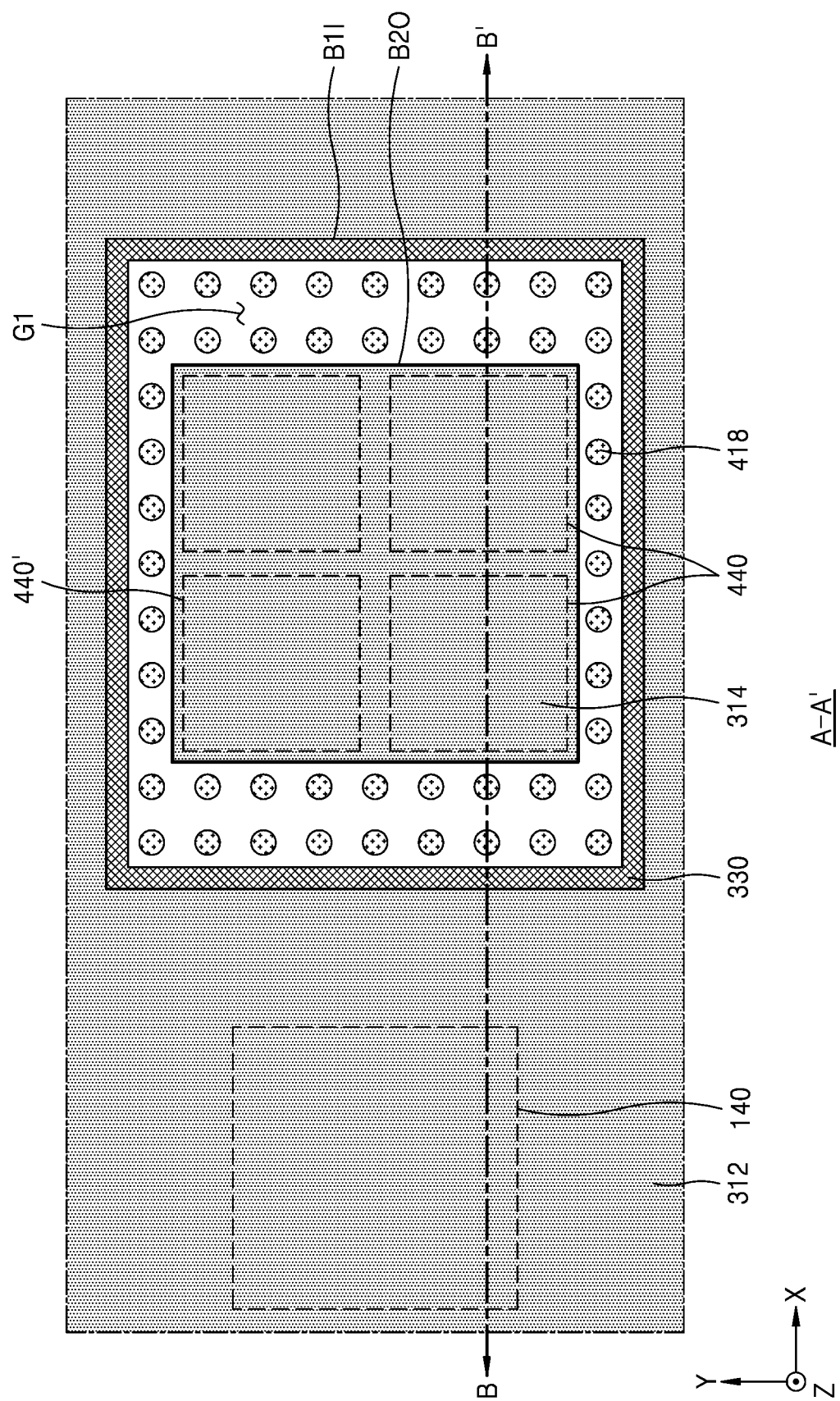
FIG. 12 is a planar view of the semiconductor package of FIG. 11 taken at a line A-A' of FIG. 11.

FIG. 11 is a cross-sectional view of a semiconductor package 1000e according to an embodiment. FIG. 12 is a planar view of the semiconductor package of FIG. 11 at line A-A' of FIG. 1A. A difference between FIGS. 3 and 11 and a difference between FIGS. 4 and 12 may be whether the first package 100 and the second package 400 respectively include a plurality of first semiconductor chips 120 and a plurality of second semiconductor chips 420. Hereinafter, the differences are mainly described.

Referring to FIGS. 11 and 12, the first package 100 may include the plurality of first semiconductor chips 120, and the second package 400 may include the plurality of second semiconductor chips 420. According to embodiments, the plurality of first semiconductor chips 120 may be sequentially stacked on the first package substrate 110 in a vertical direction. For example, each of the plurality of first semiconductor chips 120 may be sequentially stacked with an active surface thereof facing downward. For example, the plurality of first semiconductor chips 120 may be of the same type or different types. According to embodiments, the plurality of second semiconductor chips 420 may be positioned in a horizontal direction on the second package substrate 410 and mounted on the second package substrate 410. For example, all of the plurality of second semiconductor chips 420 may be directly connected to the second package substrate 410. The plurality of second semiconductor chips 420 may be of the same type or different types. Although FIG. 11 illustrates that the first package 100 and the second package 400 respectively include two first semiconductor chips 120 and two second semiconductor chips 420, the example embodiments are not limited thereto.

According to embodiments, the first projection 140 may be a projection on a plane including the heat dissipation layer 310 of a first semiconductor chip 120' that is closest to the interposer 200 as compared to others of the plurality of first semiconductor chips 120. For example, the first semiconductor chip 120' may be the first semiconductor chip 120 at the uppermost portion of the stacked plurality of first semiconductor chips 120. For example, a portion of the first portion 312 overlapping the first projection 140 may be a portion where heat generated by the plurality of first semiconductor chips 120 is most concentrated. For example, the first portion 312 may be configured to disperse heat of the portion of the first portion 312 overlapping the first projection 140, by entirely covering the upper surface of the interposer 200 except for the second portion 314 and the gap G.

According to embodiments, the second projection 440 may be a set of projections, which are shown when the plurality of second semiconductor chips 420 are projected to a plane including the heat dissipation layer 310. For example, when the plurality of second semiconductor chips 420 are projected, a plurality of individual projections 440' for the plurality of second semiconductor chips 420 may be formed. For example, the second projection 440 may be a set of the plurality of individual projections 440'. In embodiments, the second portion 314 may include the second projection 440 therein in a plan view. For example, the second portion 314 may have a plan area greater than a plan area of the second projection 440, and the boundary of the second projection 440 may be included in the second portion 314. For example, a boundary of the plurality of individual projections 440' may be inside the outer boundary B1O of the second portion 314.

Figure 13:
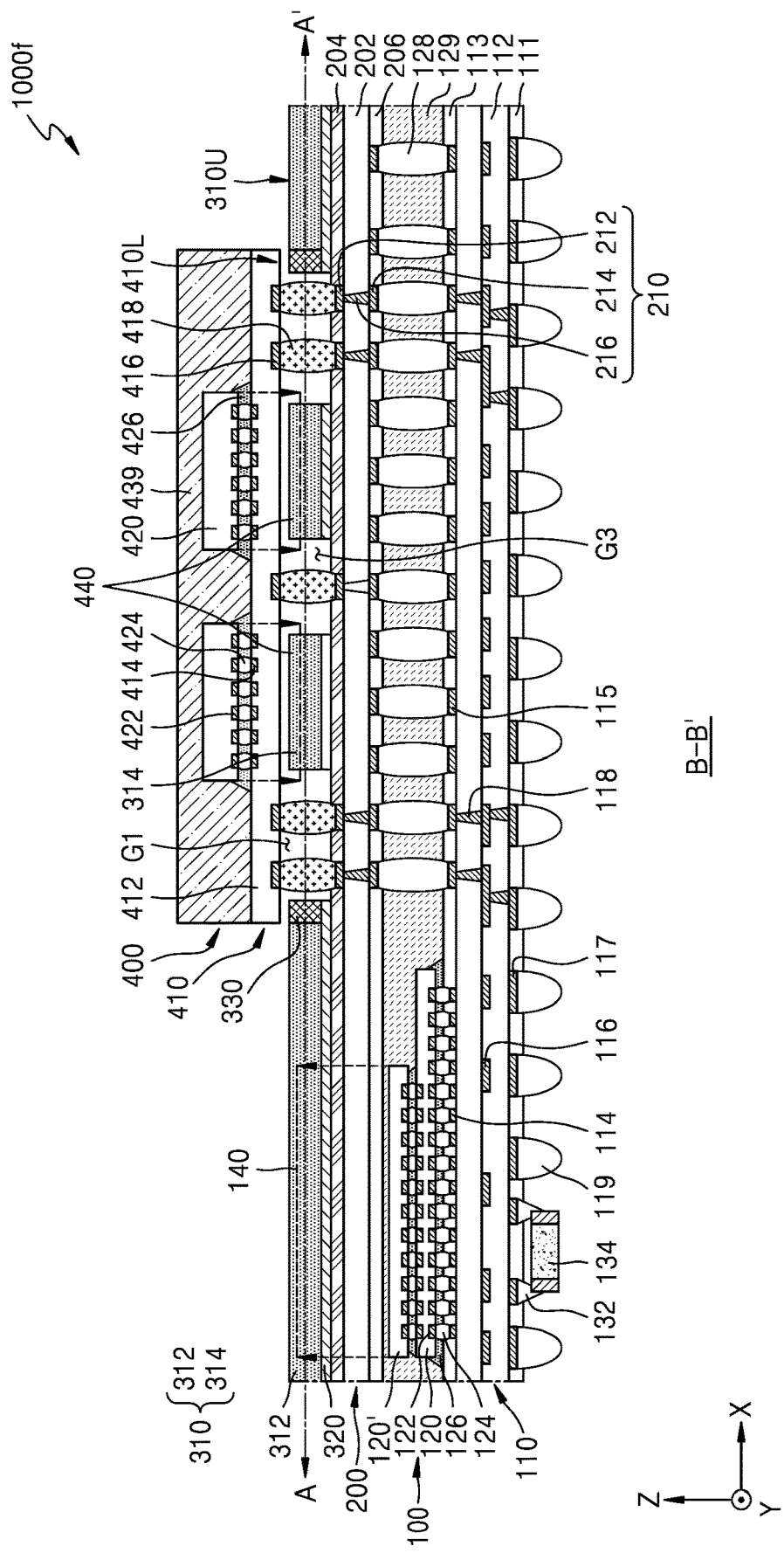
FIG. 13 is a cross-sectional view of a semiconductor package according to an example embodiment.
Figure 14:
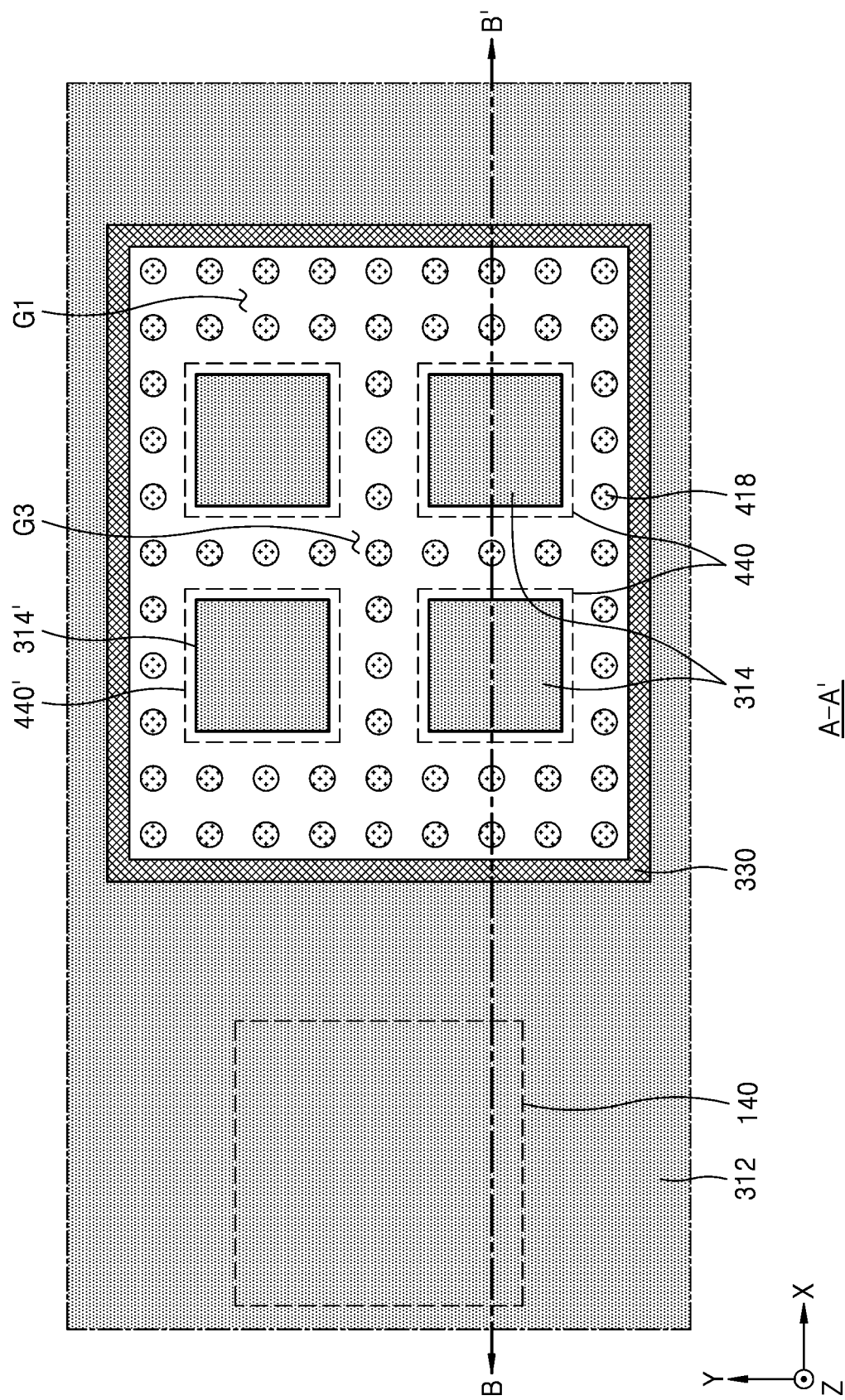
FIG. 14 is a planar view of the semiconductor package of FIG. 13 taken at a line A-A' of FIG. 13.

FIG. 13 is a cross-sectional view of a semiconductor package 1000f according to an embodiment. FIG. 14 is a planar view of the semiconductor package of FIG. 13 at a line A-A' of FIG. 13. A difference between FIGS. 11 and 13 and a difference between FIGS. 12 and 14 may be whether the second portion 314 has a divided shape to correspond to the plurality of individual projections 440'. Hereinafter, the differences are mainly described.

According to embodiments, the second portion 314 may include a plurality of heat dissipation pads 314'. According to embodiments, the plurality of heat dissipation pads 314' may be configured to individually discharge heat of the plurality of second semiconductor chips 420. For example, the plurality of heat dissipation pads 314' may respectively correspond to the plurality of individual projections 440' (that is, one to one). According to embodiments, the plurality of heat dissipation pads 314' may respectively, at least partially, overlap the plurality of individual projections 440'. For example, the plurality of heat dissipation pads 314' may include the boundary of the plurality of individual projections 440' therein in a plan view, may be included inside the boundary of the plurality of individual projections 440', and may have the boundary thereof substantially overlapping the plurality of individual projections 440'.

According to embodiments, the plurality of heat dissipation pads 314' may be spaced apart from each other. For example, a third gap G3, which is a space between the plurality of heat dissipation pads 314', may be formed. According to some embodiments, the plurality of second conductive connectors 418 may be in the third gap G3, and the plurality of second conductive connectors 418 may be positioned in the first gap G1 around an outer boundary or perimeter of the plurality of heat dissipation pads 314' and the plurality of second conductive connectors 418 in the third gap G3.

Although FIGS. 11 through 14 illustrate that the plurality of first semiconductor chips 120 are sequentially stacked in a vertical direction, and the plurality of second semiconductor chips 420 are arranged in a horizontal direction, the embodiments are not limited thereto. For example, the plurality of first semiconductor chips 120 may be arranged in a horizontal direction, and the second semiconductor chips 420 may be sequentially stacked in a vertical direction.

As described above, some embodiments have been disclosed in the drawings and the specification. While the embodiments have been described herein with reference to specific terms, it should be understood that they have been used only for the purpose of describing the technical idea of the inventive concept and not for limiting the scope of the inventive concept as defined in the claims. Thus, those with ordinary skill in the art will appreciate that various modifications and equivalent embodiments are possible without departing from the scope of the inventive concept. Therefore, the true scope of protection of the inventive concept should be determined by the technical idea of the appended claims.

While the inventive concept has been particularly shown and described with reference to embodiments thereof, it will be understood that various changes in form and details may be made therein without departing from the spirit and scope of the following claims.

What is claimed is:

1. A semiconductor package comprising:
   a first semiconductor chip on a first package substrate;
   a second semiconductor chip on a second package substrate;
   an interposer between the first semiconductor chip and the second package substrate; and
   a heat dissipation layer on the interposer,
   wherein the first and second semiconductor chips are spaced apart from each other horizontally and do not overlap in a vertical direction, and
   wherein a first portion of the heat dissipation layer at least partially overlapping the first semiconductor chip in the vertical direction and a second portion of the heat dissipation layer at least partially overlapping the second semiconductor chip in the vertical direction are spaced apart from each other, and
   the first portion is positioned around an outer boundary of the second portion.

2. The semiconductor package of claim 1, wherein the first portion comprises an inner boundary defining an interior region, and the second portion is in the interior region of the first portion.

3. The semiconductor package of claim 1, wherein the heat dissipation layer further comprises a heat insulating pattern between a first projection comprising a projection of the first semiconductor chip on a plane comprising the heat dissipation layer and a second projection comprising a projection of the second semiconductor chip on a plane comprising the heat dissipation layer.

4. The semiconductor package of claim 3, wherein the heat insulating pattern is around an outer boundary of the second portion at an inner boundary of the first portion.

5. The semiconductor package of claim 3, wherein, when the second package substrate is projected on a plane comprising the heat dissipation layer, a third projection of the second package substrate the plane comprising the heat dissipation layer at least partially overlaps the first portion, and
   the heat insulating pattern is around an outer boundary of the third projection in the first portion.

6. The semiconductor package of claim 3, wherein thermal conductivity of the heat insulating pattern is less than that of the heat dissipation layer.

7. The semiconductor package of claim 1, wherein a conductive connector is between the first portion and the second portion on the interposer.

8. The semiconductor package of claim 1, a first projection comprises a projection of the first semiconductor chip on a plane comprising the heat dissipation layer and a second projection comprises a projection of the second semiconductor chip on a plane comprising the heat dissipation layer, wherein the second portion comprises:
 a center portion in the second projection;
 an edge portion spaced apart from the center portion in an outer direction and around an outer boundary of the center portion; and
 a connection line connecting the center portion to the edge portion,
 wherein a plurality of conductive connectors is in an area between the center portion and the edge portion.

9. The semiconductor package of claim 8, wherein, when the second package substrate is projected on a plane comprising the heat dissipation layer to form a third projection, an outer boundary of the third projection is in the edge portion.

10. The semiconductor package of claim 1, further comprising an adhesive layer between the interposer and the heat dissipation layer.

11. A semiconductor package comprising:
 a first semiconductor chip on a first package substrate;
 a second semiconductor chip on a second package substrate;
 an interposer between the first semiconductor chip and the second package substrate; and
 a heat dissipation layer arranged on the interposer,
 wherein, when the first semiconductor chip and the second semiconductor chip are projected on a plane comprising the heat dissipation layer, a first projection, which is a projection of the first semiconductor chip in a first region of the plane comprising the heat dissipation layer, and a second projection, which is a projection of the second semiconductor chip in a second region of the plane comprising the heat dissipation layer, do not overlap each other, and
 wherein a first portion of the heat dissipation layer at least partially overlapping the first projection and a second portion of the heat dissipation layer at least partially overlapping the second projection are at least partially spaced apart from each other, and
 wherein the first portion is positioned around an outer boundary of the second portion, and
 connected to the second portion via a bridge portion of the heat dissipation layer.

12. The semiconductor package of claim 11, wherein the heat dissipation layer further comprises a heat insulating pattern between the first projection and the second projection.

13. The semiconductor package of claim 12, wherein the heat insulating pattern extends along an inner boundary of the first portion.

14. The semiconductor package of claim 11, wherein a plurality of conductive connectors is arranged between the first portion and the second portion on the interposer.

15. The semiconductor package of claim 11, wherein an upper surface of the heat dissipation layer is at a vertically lower level than a lower surface of the second package substrate.

16. A semiconductor package comprising:
 a first semiconductor chip on a first package substrate;
 a second semiconductor chip on a second package substrate;
 an interposer between the first semiconductor chip and the second package substrate;
 a heat dissipation layer and a conductive connector on the interposer; and
 an adhesive layer between the interposer and the heat dissipation layer,
 wherein, when the first semiconductor chip and the second semiconductor chip are projected on a plane comprising the heat dissipation layer, a first projection, which is a projection of the first semiconductor chip in a first region of the plane comprising the heat dissipation layer, and a second projection, which is a projection of the second semiconductor chip in a second region of the plane comprising the heat dissipation layer, do not overlap each other, and
 wherein a first portion of the heat dissipation layer at least partially overlapping the first projection and a second portion of the heat dissipation layer at least partially overlapping the second projection are spaced apart from each other, and
 wherein the first portion is positioned around an outer boundary of the second portion,
 the first portion comprises an inner boundary defining an interior region, and the second portion is in the interior region of the first portion, and
 the conductive connector is between the first portion and the second portion.

17. The semiconductor package of claim 16, wherein the heat dissipation layer further comprises a heat insulating pattern extending along an inner boundary of the first portion, and the heat insulating pattern is around an outer portion of the second portion between the first projection and the second projection.

18. The semiconductor package of claim 16, wherein ones of a plurality of first semiconductor chips are sequentially stacked in a vertical direction on the first package substrate, and
 the first projection is a projection of a semiconductor chip most adjacent to the interposer of the plurality of first semiconductor chips.

19. The semiconductor package of claim 16, wherein a plurality of second semiconductor chips are arranged in a horizontal direction on the second package substrate, and
 the second projection is a set of projections of the plurality of second semiconductor chips.

20. The semiconductor package of claim 19, wherein the second portion comprises a plurality of heat dissipation pads at least partially overlapping the projections of the plurality of second semiconductor chips,
 each of the plurality of heat dissipation pads are positioned to be spaced apart from each other, and
 the conductive connector is arranged between the plurality of heat dissipation pads.

* * * * *